(12) United States Patent
Saito et al.

(10) Patent No.: US 9,472,611 B2
(45) Date of Patent: Oct. 18, 2016

(54) SEMICONDUCTOR DEVICE AND METHOD OF MANUFACTURING THE SAME

(71) Applicant: FUJITSU SEMICONDUCTOR LIMITED, Yokohama-shi, Kanagawa (JP)

(72) Inventors: Hitoshi Saito, Hachioji (JP); Wensheng Wang, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/797,405

(22) Filed: Jul. 13, 2015

(65) Prior Publication Data

US 2016/0043165 A1    Feb. 11, 2016

(30) Foreign Application Priority Data

Aug. 7, 2014   (JP) .................................. 2014-161461

(51) Int. Cl.
| | | |
|---|---|---|
| H01L 29/76 | (2006.01) | |
| H01L 49/02 | (2006.01) | |
| H01L 27/06 | (2006.01) | |
| H01L 27/115 | (2006.01) | |

(52) U.S. Cl.
CPC ........... *H01L 28/75* (2013.01); *H01L 27/0629* (2013.01); *H01L 27/11507* (2013.01); *H01L 27/11509* (2013.01); *H01L 28/87* (2013.01)

(58) Field of Classification Search
CPC ..................... H01L 27/11507; H01L 27/0629; H01L 27/11509; H01L 28/75; H01L 28/87
USPC ........................................................ 257/295
See application file for complete search history.

(56) References Cited

U.S. PATENT DOCUMENTS

| | | | | |
|---|---|---|---|---|
| 6,611,015 B2* | 8/2003 | Ozaki | ............... | H01L 27/11507 257/295 |
| 6,677,630 B1* | 1/2004 | Kanaya | ............. | H01L 27/11507 257/213 |
| 7,700,987 B2* | 4/2010 | Kanaya | ............. | H01L 27/11502 257/306 |
| 7,763,921 B2* | 7/2010 | Wang | .................. | H01L 21/2855 257/295 |
| 2002/0033494 A1 | 3/2002 | Ozaki et al. | | |
| 2002/0173111 A1 | 11/2002 | Kasai | | |
| 2005/0176199 A1 | 8/2005 | Ozaki et al. | | |
| 2008/0067567 A1* | 3/2008 | Kanaya | ............. | H01L 27/11502 257/295 |
| 2011/0062503 A1* | 3/2011 | Konno | ............. | H01L 27/11507 257/295 |

FOREIGN PATENT DOCUMENTS

| | | |
|---|---|---|
| JP | 2002-94022 A | 3/2002 |
| JP | 2008-205114 A | 9/2008 |
| JP | 2010-10603 A | 1/2010 |

OTHER PUBLICATIONS

German Office Action dated May 4, 2016, issued in German Patent Application No. 10 2015 213 920.4, w/ translation (17 pages).

* cited by examiner

*Primary Examiner* — Luan C Thai
(74) *Attorney, Agent, or Firm* — Westerman, Hattori, Daniels & Adrian, LLP

(57) ABSTRACT

A semiconductor device includes: a semiconductor substrate; a base above the semiconductor substrate; a first conductive plug in the base; a memory cell region in the base; and a logic circuit region connected to the memory cell region, the logic circuit including a first capacitor. The first capacitor includes: a first bottom electrode, a part of a lower surface of the first bottom electrode being in contact with the first conductive plug; a first insulating film on the first bottom electrode; and a first top electrode on the first insulating film. The first top electrode is spaced apart from the first conductive plug in planar view.

20 Claims, 24 Drawing Sheets

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2014-161461, filed on Aug. 7, 2014, the entire contents of which are incorporated herein by reference.

FIELD

The embodiments relate a semiconductor device and a method of manufacturing the same.

BACKGROUND

There is a semiconductor device including a memory cell region and a logic circuit region. Memory cells are disposed in the memory cell region, and each of the memory cells includes a memory capacitor and a transistor. The logic circuit region includes a logic circuit, a transistor for reducing signal noise in the logic circuit, a smoothing capacitor. For example, the logic circuit region sometimes includes a capacitor for a time constant, which is used when a transistor is driven after generating an electromotive force. An area of the smoothing capacitor is larger than an area of the memory capacitor.

As a structure of the smoothing capacitor, there are a stacked structure and a planar structure. The stacked structure is more advantageous than the planar structure in terms that the stacked structure suppresses an increase in area. In the stacked structure, a lower surface of a bottom electrode of the smoothing capacitor is in contact with a lower plug.

However, the smoothing capacitor of the stacked structure has a disadvantage in that a leakage current easily occurs.

Patent Literature 1: Japanese Laid-Open Patent Publication No. 2002-94022

Patent Literature 2: Japanese Laid-Open Patent Publication No. 2008-205114

Patent Literature 3: Japanese Laid-Open Patent Publication No. 2010-10603

SUMMARY

According to an aspect of the embodiments, a semiconductor device includes: a semiconductor substrate; a base above the semiconductor substrate; a first conductive plug in the base; a memory cell region in the base; and a logic circuit region connected to the memory cell region, the logic circuit including a first capacitor. The first capacitor includes: a first bottom electrode, a part of a lower surface of the first bottom electrode being in contact with the first conductive plug; a first insulating film on the first bottom electrode; and a first top electrode on the first insulating film. The first top electrode is spaced apart from the first conductive plug in planar view.

According to another aspect of the embodiments, a method of manufacturing a semiconductor device includes: forming a base including a memory cell region and a logic circuit region above a semiconductor substrate; forming a first conductive plug in the logic circuit region of the base; and forming a first capacitor in the logic circuit region. The forming of the first capacitor includes: forming a first bottom electrode, a part of a lower surface of the first bottom electrode being in contact with the first conductive plug; forming an first insulating film on the first bottom electrode; and forming a first top electrode on the first insulating film, the first top electrode being spaced apart from the first conductive plug in planar view.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The inventors studied hard in order to find a reason why a leakage current easily occurs in a stacked capacitor in a related art. As a result, it was found that, since a lower surface of a bottom electrode is in contact with not only a lower plug but also a base film, an insulating film for example, in the vicinity of the lower plug, there is a difference in crystallinity between a portion grown from an upper surface of the lower plug and a portion grown from an upper surface of the base film. This is because the bottom electrode is formed by a crystal growing method, and there is a difference more than a little in nucleation condition at the initial stage of the growing. In addition, although a planarization process is performed on the lower plug and the base film before the formation of the bottom electrode, it is quite difficult to completely exclude a step difference between the lower plug and the base film according to a difference in material. A difference in crystallinity caused by the step difference also exists. Since a capacitor insulating film of the capacitor is formed on the bottom electrode by a crystal growing method, the difference in crystallinity is also introduced into the capacitor insulating film, and particularly, the difference in crystallinity is remarkably great after crystallization annealing. In this manner, it was found out that, since the capacitor insulating film includes some parts different in crystallinity, a leakage current easily flows through an interface between the parts. Therefore, the inventors studied harder in order to suppress the leakage current, and as a result, the inventors contrived the following embodiments.

Hereinafter, embodiments will be described in detail with reference to the attached drawings.

First Embodiment

Figure 1:
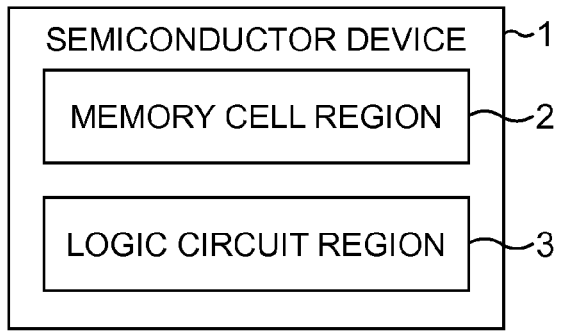
FIG. 1 is a block diagram illustrating a configuration of a semiconductor device according to a first embodiment.
Figure 2A:
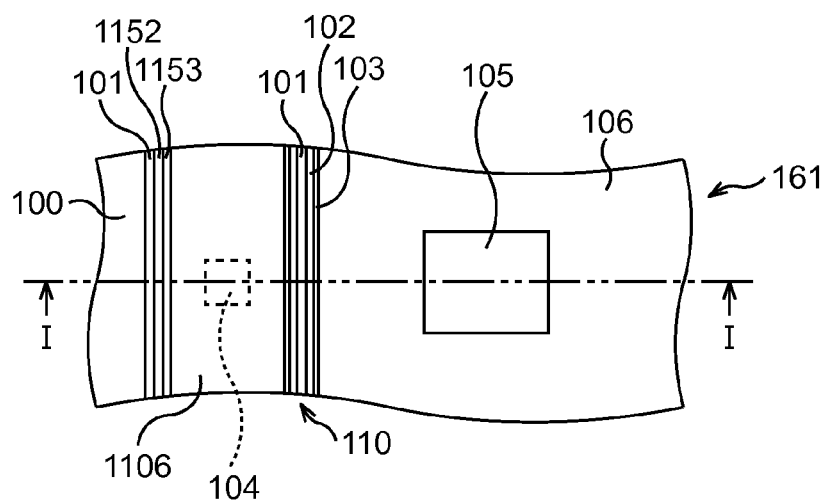
FIG. 2A is a plan diagram illustrating a configuration of the semiconductor device according to the first embodiment.
Figure 2B:
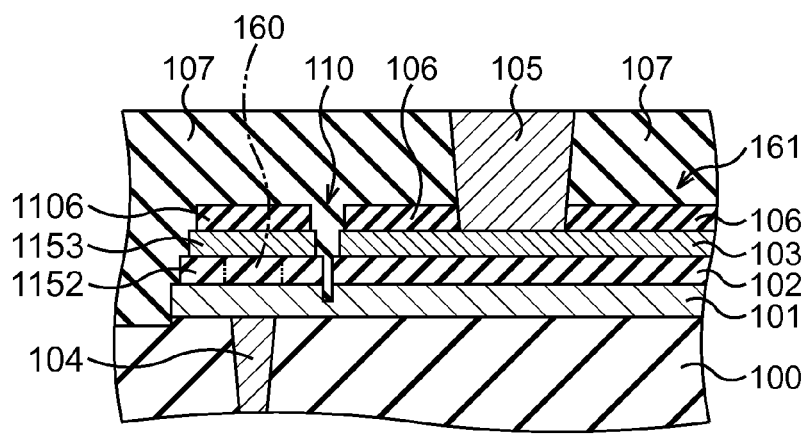
FIG. 2B is a cross-sectional diagram illustrating a configuration of the semiconductor device according to the first embodiment.

First, a first embodiment will be described. The first embodiment is an example of a ferroelectric memory. FIG. 1 is a block diagram illustrating a configuration of a semiconductor device according to the first embodiment. FIGS. 2A and 2B are a plan diagram and a cross-sectional diagram illustrating a configuration of the semiconductor device according to the first embodiment, respectively. FIG. 2A is a plan diagram, and FIG. 2B is a cross-sectional diagram taken along line I-I of FIG. 2A.

As illustrated in FIG. 1, a memory cell region 2 and a logic circuit region 3 are disposed in the semiconductor device 1 according to the first embodiment. The logic circuit region 3 is connected to the memory cell region 2 and includes a smoothing capacitor.

In the first embodiment, as illustrated in FIGS. 2A and 2B, a smoothing capacitor 161 includes a bottom electrode 101 on a base 100 such as an interlayer insulating film, a capacitor insulating film 102 on the bottom electrode 101, and an top electrode 103 on the capacitor insulating film 102. A conductive plug 104 is formed in the base 100, and a part of a lower surface of the bottom electrode 101 is in contact with the conductive plug 104. A pseudo capacitor insulating film 1152 and a pseudo top electrode 1153 including a portion immediately above the conductive plug 104 are also formed on the bottom electrode 101 besides the capacitor insulating film 102 and the top electrode 103. The top electrode 103 is electrically insulated from the pseudo top electrode 1153 by a groove 110, and the capacitor insulating film 102 is separated from the pseudo capacitor insulating film 1152 by the groove 110. Namely, in planar view, the top electrode 103 is spaced apart from the conductive plug 104, and the pseudo capacitor insulating film 1152 and the pseudo top electrode 1153 are formed immediately above a part of the bottom electrode 101 which the part is in contact with the conductive plug 104.

A hard mask 106 is formed on the top electrode 103, and a pseudo hard mark 1106 is formed on the pseudo top electrode 1153. The hard mask 106 is separated from the pseudo hard mark 1106 by the groove 110. Although the groove 110 reaches an inner portion of the bottom electrode 101, a part of the bottom electrode 101 under the pseudo capacitor insulating film 1152 and a part of the bottom electrode 101 under the capacitor insulating film 102 are connected to each other. An interlayer insulating film 107 which covers the smoothing capacitor 161, the hard mask 106, the pseudo hard mark 1106, and the like is formed above the base 100, and a conductive plug 105 which is in contact with the top electrode 103 is formed in the interlayer insulating film 107 and the hard mask 106. In FIG. 2A, the interlayer insulating film 107 is omitted in illustration.

In the smoothing capacitor 161, as described in detail later, although a heterogeneous region 160 which occurs during formation of the capacitor insulating film 102 and the pseudo capacitor insulating film 1152 caused by a difference in material between the base 100 and the conductive plug 104 exists immediately above and in the vicinity of the conductive plug 104, a heterogeneous region does not exist in a part spaced apart therefrom. Namely, the heterogeneous region 160 exists in the pseudo capacitor insulating film 1152 between the bottom electrode 101 and the pseudo top electrode 1153, and a heterogeneous region does not exist in the capacitor insulating film 102 between the bottom electrode 101 and the top electrode 103. The top electrode 103 is electrically insulated from the pseudo top electrode 1153. Thus, even when a voltage is applied between the top electrode 103 and the bottom electrode 101, a leakage current through the heterogeneous region 160 as a path does not flow. Accordingly, it is possible to suppress a leakage current occurring in a stacked capacitor such as a smoothing capacitor in a related art.

The capacitor insulating film 102 does not need to be separated from the pseudo capacitor insulating film 1152 by the groove 110, if the groove 110 electrically insulates the top electrode 103 from the pseudo top electrode 1153 on the heterogeneous region 160.

Next, a method of manufacturing the semiconductor device according to the first embodiment will be described. FIGS. 3A to 3I are cross-sectional diagrams illustrating a procedure of processes of the method of manufacturing the semiconductor device according to the first embodiment.

Figure 3A:
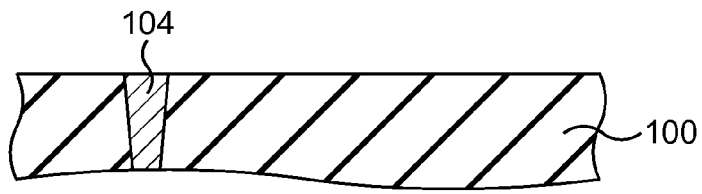
FIGS. 3A to 3I are cross-sectional diagrams illustrating a procedure of processes of a method of manufacturing the semiconductor device according to the first embodiment.

First, as illustrated in FIG. 3A, the base 100 such as an interlayer insulating film is formed above a semiconductor substrate by a chemical vapor deposition (CVD) method, for example. A thickness of the base 100 is about 500 nm, for example. As a material for the base 100, boron phosphosilicate glass (BPSG) and phospho silicate glass (PSG) are exemplified, for example. A silicon oxide film may be formed by a high density plasma (HDP) CVD method, and a silicon oxide film may be formed using tetraethylorthosilicate (TEOS) and $O_3$. Then, a contact hole is formed in the base 100 by etching using a $CF_4$ series gas, a $C_2F_6$ series gas, or a $C_4F_8$ series gas, and the conductive plug 104 is formed in the contact hole. The conductive plug 104 may be formed by burying a metal film such as a tungsten film in the contact hole by a CVD method or the like, for example.

Figure 3B:
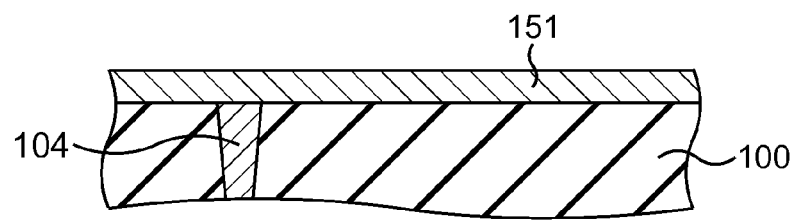

Thereafter, as illustrated in FIG. 3B, a conductive film 151 is formed so that a part of a lower surface of the conductive film 151 is in contact with the conductive plug 104. A thickness of the conductive film 151 is about 100 nm, for example. As a material for the conductive film 151, titanium (Ti), titanium nitride (TiN), titanium aluminum nitride (TiAlN), iridium oxide (IrO), iridium (Ir), and platinum (Pt) are exemplified. The conductive film 151 may be formed by a sputtering method, for example. The conductive film 151 includes a region where crystallinity is heterogeneous based on a difference in material between the conductive plug 104 and the base 100.

Figure 3C:
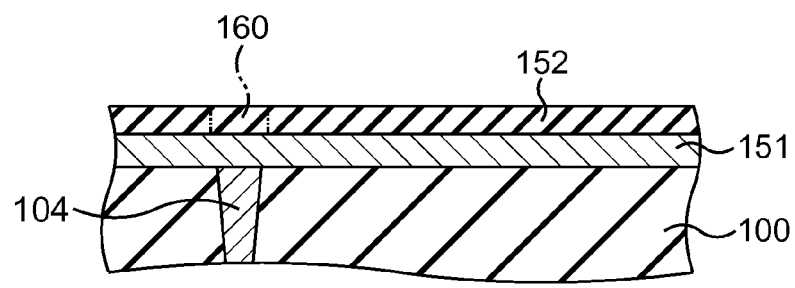

Subsequently, as illustrated in FIG. 3C, a ferroelectric film 152 such as a lead zirconate titanate (PZT) film is formed on the conductive film 151. A thickness of the ferroelectric film 152 is in a range of about 5 nm to 100 nm, for example. The ferroelectric film 152 may be formed by a sputtering method or a metal organic chemical vapor deposition (MOCVD) method, for example. Then, a crystal structure of the ferroelectric film 152 is made to be a layered perovskite structure by an annealing process in a predetermined temperature range. As an example of the annealing process, the semiconductor substrate is heated under an ordinary pressure in oxygen atmosphere. The ferroelectric film 152 includes the heterogeneous region 160 based on a difference in material between the conductive plug 104 and the base 100. The heterogeneous region 160 exists immediately above and in the vicinity of the conductive plug 104.

Figure 3D:
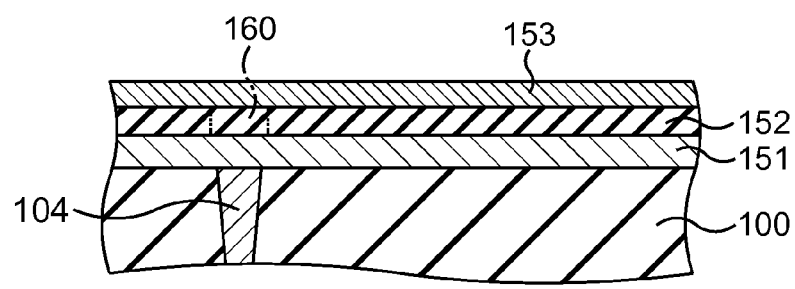

Thereafter, as illustrated in FIG. 3D, a conductive film 153 is formed on the ferroelectric film 152. As the conductive film 153, an iridium oxide film or the like is formed.

Figure 3E:
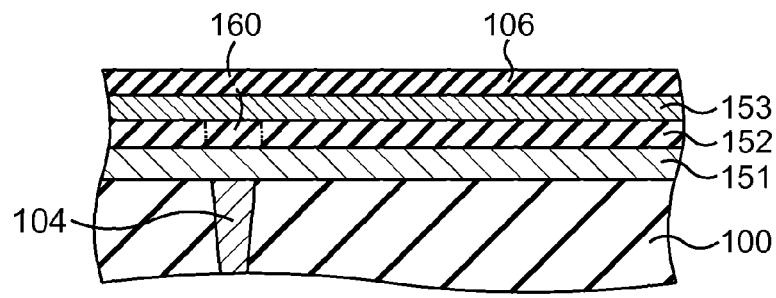

Subsequently, as illustrated in FIG. 3E, the hard mask 106 is formed on the conductive film 153. As the hard mask 106, a titanium nitride film, a silicon oxide film, or the like is formed.

Figure 3F:
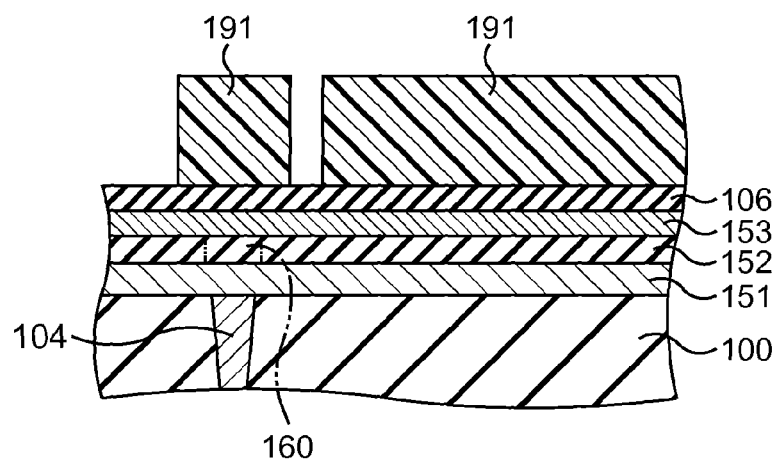

Then, as illustrated in FIG. 3F, a mask 191 which covers a region of the hard mask 106 which is to be left and exposes the other region is formed on the hard mask 106. The mask 191 roughly covers a region where the bottom electrode 101 is to be formed and exposes a region where the groove 110 is to be formed. A width of the region where the groove 110 is to be formed is about 60 nm. A mask of photoresist is formed as the mask 191, for example.

Figure 3G:
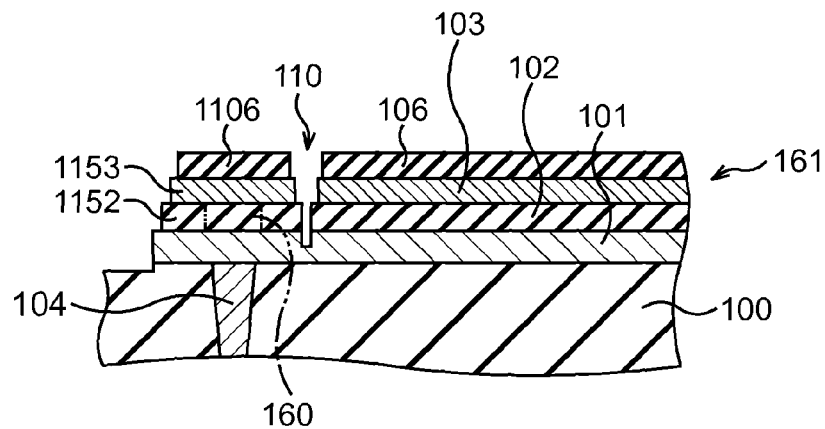

Thereafter, as illustrated in FIG. 3G, the groove 110 which reaches the inner portion of the conductive film 151 is formed by etching the hard mask 106, the conductive film 153, the ferroelectric film 152, and the conductive film 151. As a result, the smoothing capacitor 161 including the top electrode 103, the capacitor insulating film 102, and the bottom electrode 101 is formed. The pseudo hard mark 1106, the pseudo top electrode 1153, and the pseudo capacitor insulating film 1152 are also formed. At this time, due to the influence of microloading, in a time to the extent of over-etching the base 100 around the bottom electrode 101, the groove 110 electrically insulates the top electrode 103 from the pseudo top electrode 1153, and the groove 110 does not reach the base 100. Namely, the portion under the capacitor insulating film 102 of the bottom electrode 101 remains electrically connected to the conductive plug 104. The top electrode 103 is electrically insulated from the pseudo top electrode 1153 on the heterogeneous region 160 by the etching. In a case where the mask 191 remains after the etching, the mask 191 is removed.

Figure 3H:
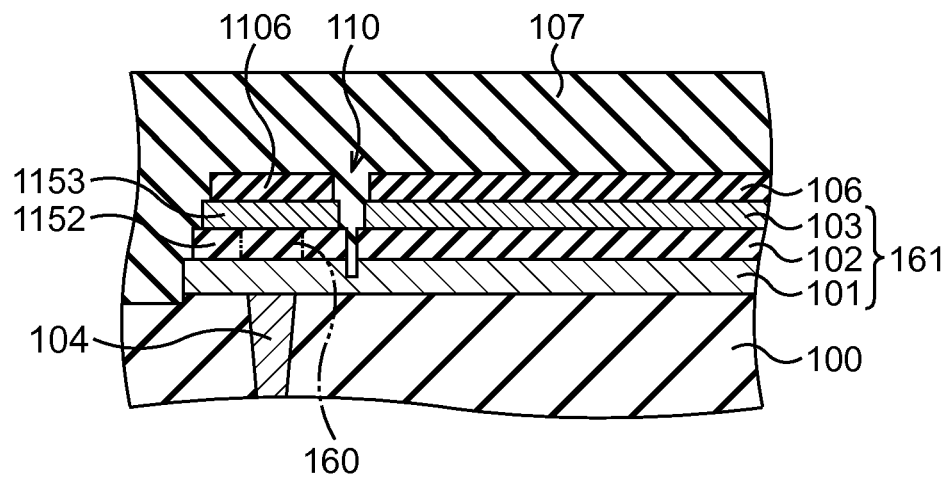

Subsequently, as illustrated in FIG. 3H, the interlayer insulating film 107 which covers the smoothing capacitor 161, the hard mask 106, the pseudo hard mark 1106, and the like is formed above the base 100.

Figure 3I:
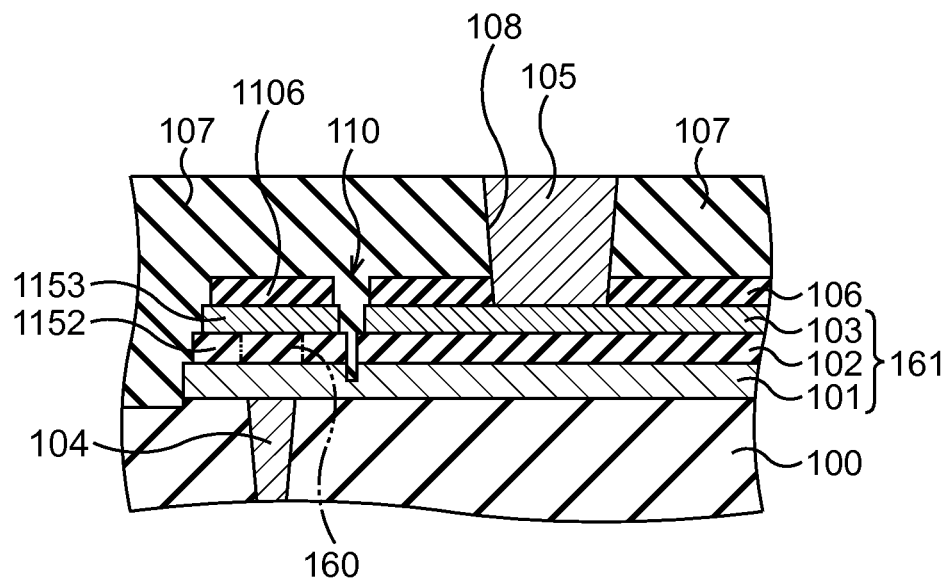

Then, as illustrated in FIG. 3I, an opening 108 which reaches the top electrode 103 is formed in the interlayer insulating film 107 and the hard mask 106, and the conductive plug 105 is formed in the opening 108.

Then, upper layer wire lines, bonding pads, and the like are formed as necessary, and the semiconductor device is completed.

According to this manufacturing method, although the pseudo capacitor insulating film 1152 includes the heterogeneous region 160, where the leakage current easily flows, the top electrode 103 is electrically insulated from the pseudo top electrode 1153 on the heterogeneous region 160. Thus, a voltage between the top electrode 103 and the bottom electrode 101 is not applied to the heterogeneous region 160. Accordingly, although a voltage is applied between the top electrode 103 and the bottom electrode 101, it is possible to suppress the leakage current occurring in a stacked capacitor such as a smoothing capacitor of a related art.

Second Embodiment

Figure 4A:
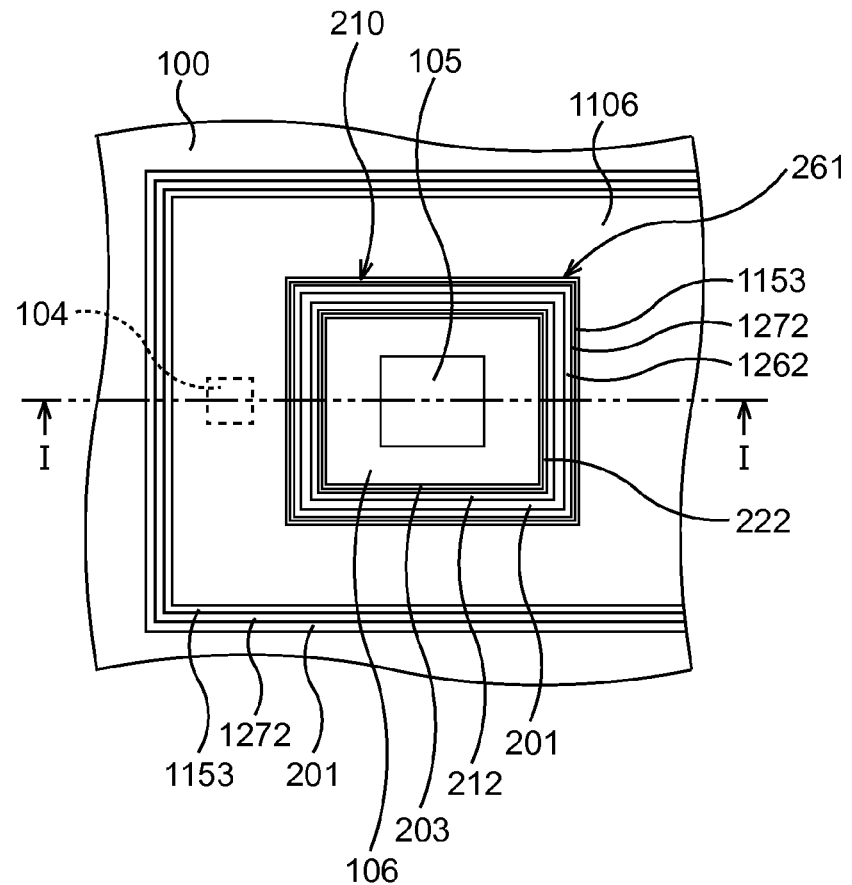
FIG. 4A is a plan diagram illustrating a configuration of a semiconductor device according to a second embodiment.
Figure 4B:
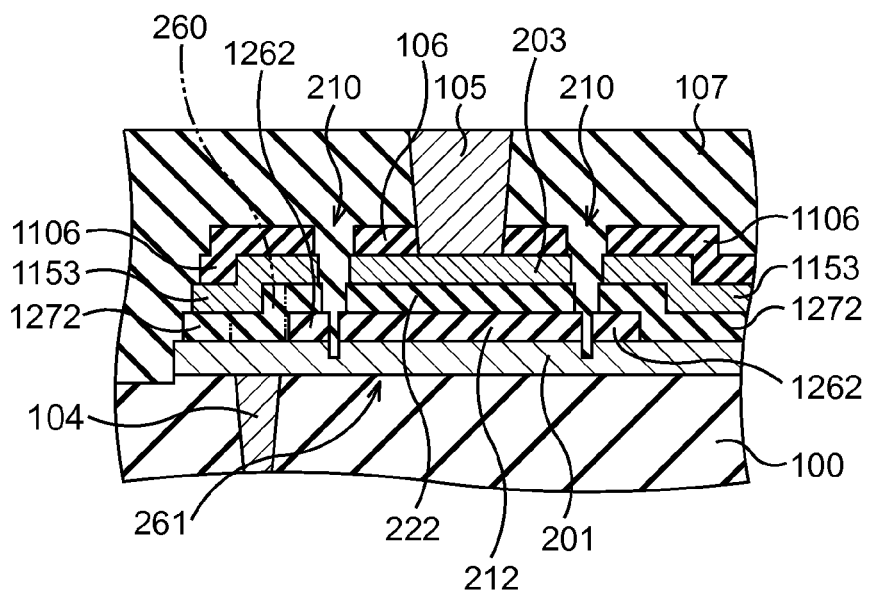
FIG. 4B is a cross-sectional diagram illustrating a configuration of the semiconductor device according to the second embodiment.

Next, a second embodiment will be described. The second embodiment is an example of a ferroelectric memory. FIGS. 4A and 4B are a plan diagram and a cross-sectional diagram illustrating a configuration of a semiconductor device according to the second embodiment, respectively. FIG. 4A is a plan diagram, and FIG. 4B is a cross-sectional diagram taken along line I-I of FIG. 4A.

Similarly to the first embodiment, the semiconductor device according to the second embodiment also includes a memory cell region and a logic circuit region. The logic circuit region is connected to the memory cell region and includes a smoothing capacitor.

In the second embodiment, as illustrated in FIGS. 4A and 4B, a smoothing capacitor 261 includes a bottom electrode 201 on a base 100 such as an interlayer insulating film, a lower capacitor insulating film 212 on the bottom electrode 201, an upper capacitor insulating film 222 on the lower capacitor insulating film 212, and an top electrode 203 on the upper capacitor insulating film 222. The conductive plug 104 is formed in the base 100, and a part of a lower surface of the bottom electrode 201 is in contact with the conductive plug 104. A pseudo upper capacitor insulating film 1272, a pseudo lower capacitor insulating film 1262, and the pseudo top electrode 1153 including a portion immediately above the conductive plug 104 are also formed on the bottom electrode 201 besides the lower capacitor insulating film 212, the upper capacitor insulating film 222, and the top electrode 203. The top electrode 203 is electrically insulated from the pseudo top electrode 1153 by a groove 210, and the upper capacitor insulating film 222 and the lower capacitor insulating film 212 are separated from the pseudo upper capacitor insulating film 1272 and the pseudo lower capacitor insulating film 1262 by the groove 210. A plane shape of the groove 210 is, for example, annular.

The hard mask 106 is formed on the top electrode 203, and the pseudo hard mark 1106 is formed on the pseudo top electrode 1153. The hard mask 106 is separated from the pseudo hard mark 1106 by the groove 210. Although the groove 210 reaches an inner portion of the bottom electrode 201, a part of the bottom electrode 201 under the pseudo lower capacitor insulating film 1262 and the pseudo upper capacitor insulating film 1272 is connected to a part of the bottom electrode 201 under the lower capacitor insulating film 212 and the upper capacitor insulating film 222. The interlayer insulating film 107 which covers the smoothing capacitor 261, the hard mask 106, the pseudo hard mark 1106, and the like is formed above the base 100, and the conductive plug 105 which is in contact with the top electrode 103 is formed in the interlayer insulating film 107 and the hard mask 106. In FIG. 4A, the interlayer insulating film 107 is omitted in illustration.

In the smoothing capacitor 261, as described in detail later, although a heterogeneous region 260 which occurs during formation of the upper capacitor insulating film 222 and the pseudo upper capacitor insulating film 1272 caused by a difference in material between the base 100 and the conductive plug 104 exists immediately above and in the vicinity of the conductive plug 104, a heterogeneous region does not exist in a portion spaced apart therefrom. Namely, the heterogeneous region 260 exists in the pseudo upper capacitor insulating film 1272 between the bottom electrode 201 and the pseudo top electrode 1153, and a heterogeneous region does not exist in the lower capacitor insulating film 212 and the upper capacitor insulating film 222 between the bottom electrode 201 and the top electrode 203. The top electrode 203 is electrically insulated from the pseudo top electrode 1153. Thus, similarly to the smoothing capacitor 161, in the smoothing capacitor 261, it is possible to suppress a leakage current occurring in the stacked capacitor such as a smoothing capacitor in a related art.

The lower capacitor insulating film 212 and the upper capacitor insulating film 222 do not need to be separated from the pseudo lower capacitor insulating film 1262 and the pseudo upper capacitor insulating film 1272 by the groove 210, if the groove 210 electrically insulates the top electrode 203 from the pseudo top electrode 1153 on the heterogeneous region 260.

Next, a method of manufacturing the semiconductor device according to the second embodiment will be described. FIGS. 5A to 5J are cross-sectional diagrams illustrating a procedure of processes of the method of manufacturing the semiconductor device according to the second embodiment.

Figure 5A:
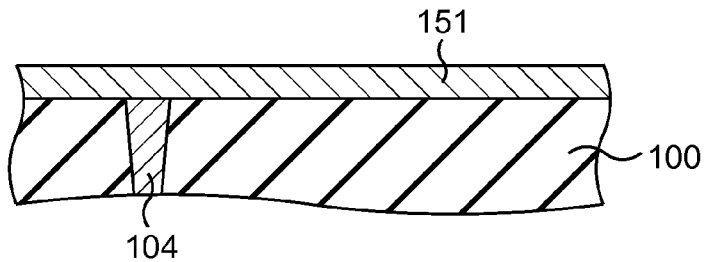
FIGS. 5A to 5J are cross-sectional diagrams illustrating a procedure of processes of a method of manufacturing the semiconductor device according to the second embodiment.

First, as illustrated in FIG. 5A, similarly to the first embodiment, the processes up to the formation of the conductive film 151 are performed.

Figure 5B:
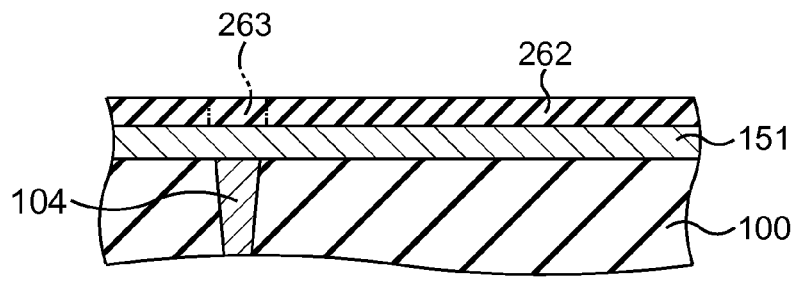

Then, as illustrated in FIG. 5B, a ferroelectric film 262 such as a PZT film is formed on the conductive film 151. A thickness of the ferroelectric film 262 is in a range of about 5 nm to 100 nm, for example. The ferroelectric film 262 may be formed by a sputtering method or an MOCVD method, for example. The ferroelectric film 262 includes a heterogeneous region 263 based on a difference in material between the conductive plug 104 and the base 100. The heterogeneous region 263 exists immediately above and in the vicinity of the conductive plug 104.

Figure 5C:
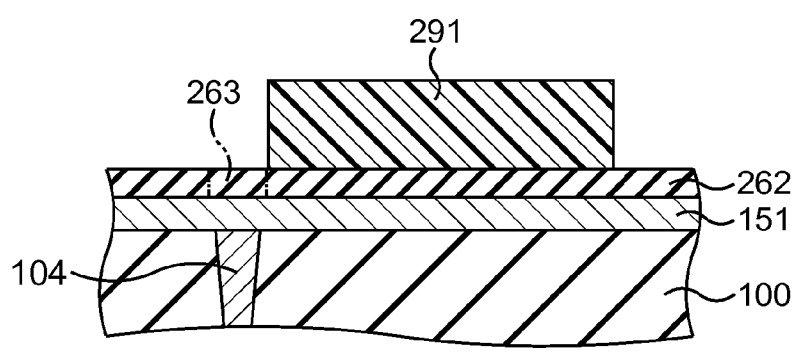

Then, as illustrated in FIG. 5C, a mask 291 which covers a region of the lower capacitor insulating film 212 which is to be left and exposes the other region is formed on the ferroelectric film 262. A mask of photoresist is formed as the mask 291, for example.

Figure 5D:
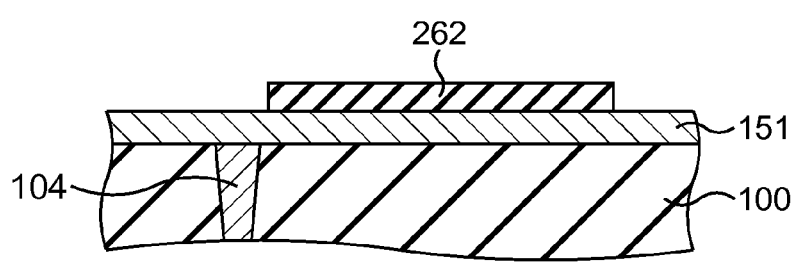

Subsequently, as illustrated in FIG. 5D, the ferroelectric film 262 is etched, and the mask 291 is removed. The entire or a part of the heterogeneous region 263 is removed by the etching.

Figure 5E:
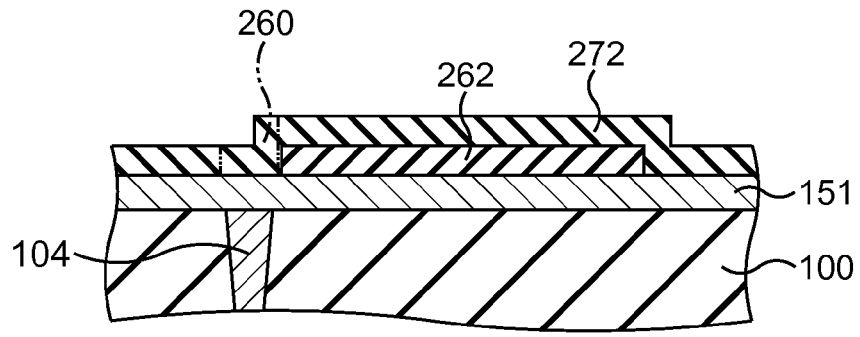

Then, as illustrated in FIG. 5E, a ferroelectric film 272 such as a PZT film which covers the ferroelectric film 262 is formed on the conductive film 151. A thickness of the ferroelectric film 272 is in a range of about 5 nm to 100 nm, for example. The ferroelectric film 272 may be formed by a sputtering method or an MOCVD method, for example. Then, each crystal structure of the ferroelectric film 262 and the ferroelectric film 272 is made to be a layered perovskite structure by an annealing process in a predetermined temperature range. As an example of the annealing process, the semiconductor substrate is heated under an ordinary pressure in oxygen atmosphere. The ferroelectric film 272 includes the heterogeneous region 260 based on the difference in material between the conductive plug 104 and the base 100. The heterogeneous region 260 exists immediately above and in the vicinity of the conductive plug 104. The heterogeneous region 263 may remain in the ferroelectric film 262.

Figure 5F:
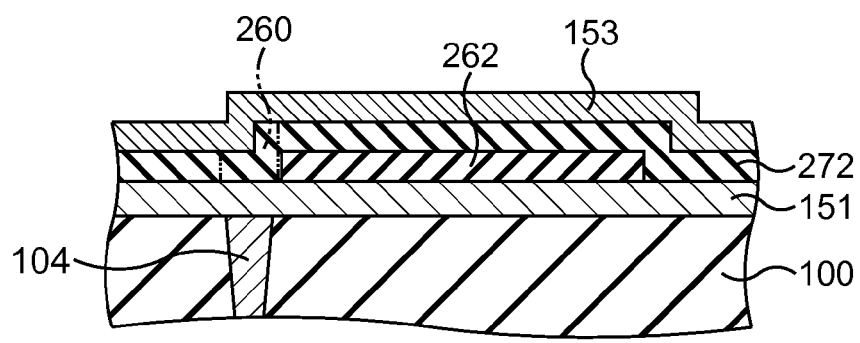
Figure 5G:
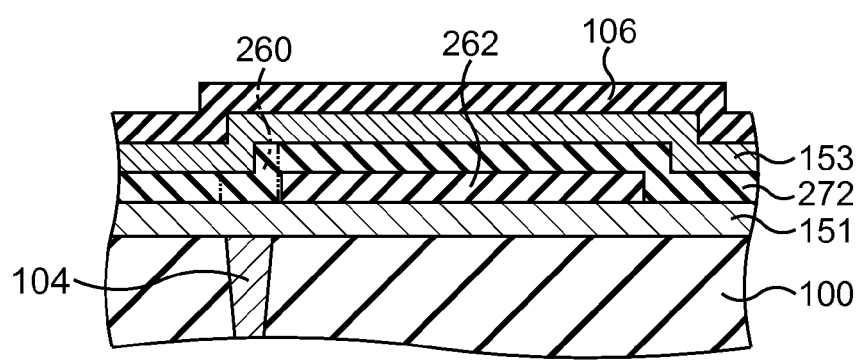

Subsequently, the conductive film 153 is formed on the ferroelectric film 272, as illustrated in FIG. 5F, and the hard mask 106 is formed on the conductive film 153, as illustrated in FIG. 5G.

Figure 5H:
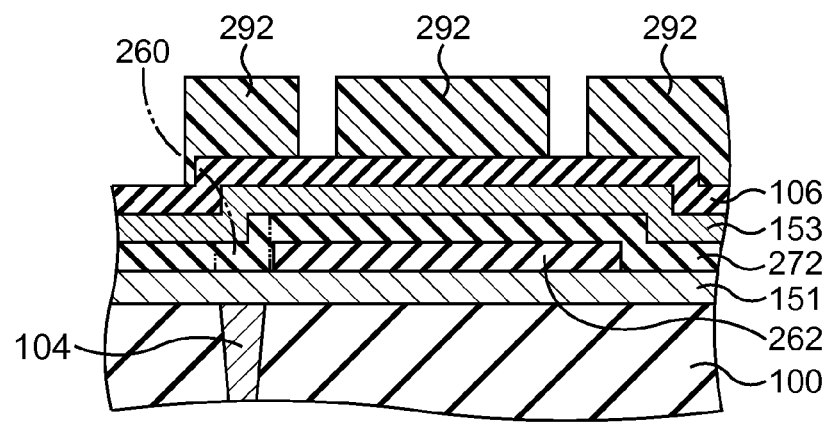

Then, as illustrated in FIG. 5H, a mask 292 which covers a region of the hard mask 106 which is to be left and exposes the other region is formed on the hard mask 106. The mask 292 roughly covers a region where the bottom electrode 201 is to be formed and exposes a region where the groove 210 is to be formed. A width of the region where the groove 210 is to be formed is about 60 nm. A mask of photoresist is formed as the mask 292, for example.

Figure 5I:
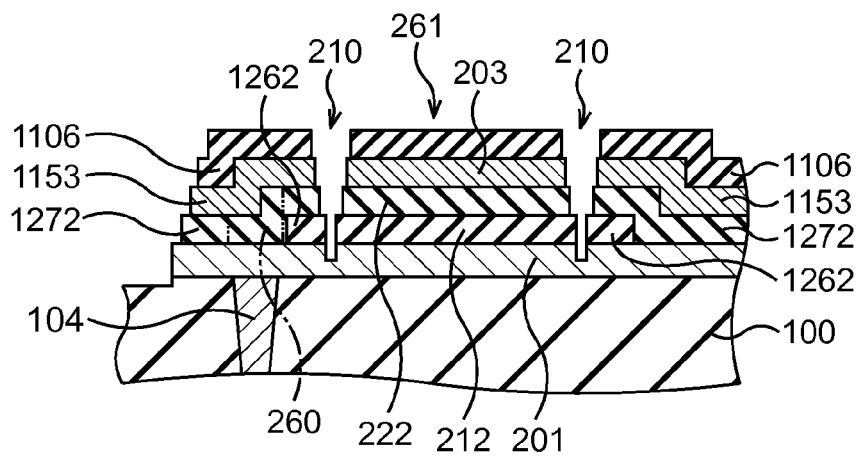

Thereafter, as illustrated in FIG. 5I, the groove 210 having an annular plane shape which reaches the inner portion of the conductive film 151 is formed by etching the hard mask 106, the conductive film 153, the ferroelectric film 272, the ferroelectric film 262, and the conductive film 151. As a result, the smoothing capacitor 261 including the top electrode 203, the upper capacitor insulating film 222, the lower capacitor insulating film 212, and the bottom electrode 201 is formed. The pseudo hard mark 1106, the pseudo top electrode 1153, the pseudo upper capacitor insulating film 1272, and the pseudo lower capacitor insulating film 1262 are also formed. At this time, due to the influence of microloading, in a time to the extent of over-etching the base 100 around the bottom electrode 201, the groove 210 electrically insulates the top electrode 203 from the pseudo top electrode 1153, and the groove 210 does not reach the base 100. Namely, the portion under the lower capacitor insulating film 212 and the upper capacitor insulating film 222 of the bottom electrode 201 remains electrically connected to the conductive plug 104. The top electrode 203 is electrically insulated from the pseudo top electrode 1153 on the heterogeneous region 260 by the etching. In a case where the mask 292 remains after the etching, the mask 292 is removed.

Figure 5J:
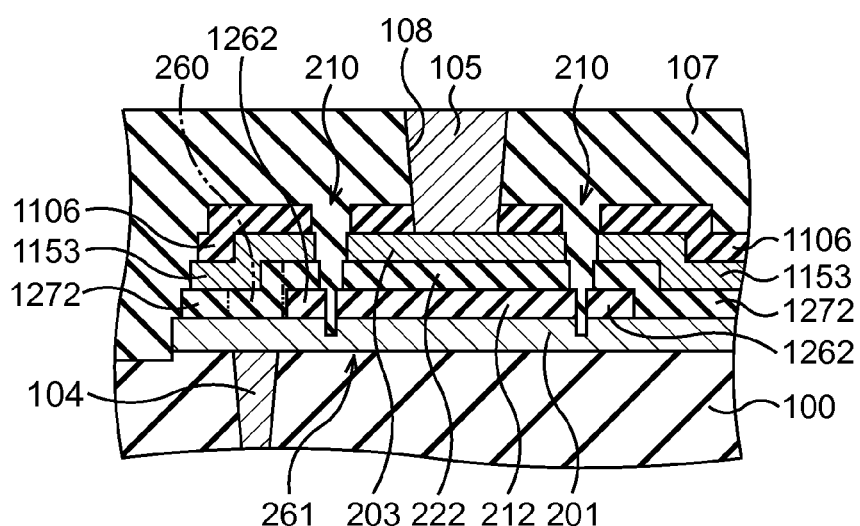

Subsequently, as illustrated in FIG. 5J, the interlayer insulating film 107 which covers the smoothing capacitor 261 and the like is formed above the base 100, an opening 108 which reaches the top electrode 103 is formed in the interlayer insulating film 107 and the hard mask 106, and the conductive plug 105 is formed in the opening 108.

Then, upper layer wire lines, bonding pads, and the like are formed as necessary, and the semiconductor device is completed.

According to this manufacturing method, although the pseudo upper capacitor insulating film 1272 includes the heterogeneous region 260, where the leakage current easily flows, the top electrode 203 is electrically insulated from the pseudo top electrode 1153 on the heterogeneous region 260.

Even in a case where the heterogeneous region 263, where the leakage current easily flows, remains in the pseudo lower capacitor insulating film 1262, the top electrode 203 is electrically insulated from the pseudo top electrode 1153 on the heterogeneous region 263. Thus, a voltage between the top electrode 203 and the bottom electrode 201 is not applied to the heterogeneous region 260 (and the heterogeneous region 263). Accordingly, although a voltage is applied between the top electrode 203 and the bottom electrode 201, it is possible to suppress the leakage current occurring in a stacked capacitor such as a smoothing capacitor of a related art.

Third Embodiment

Figure 6:
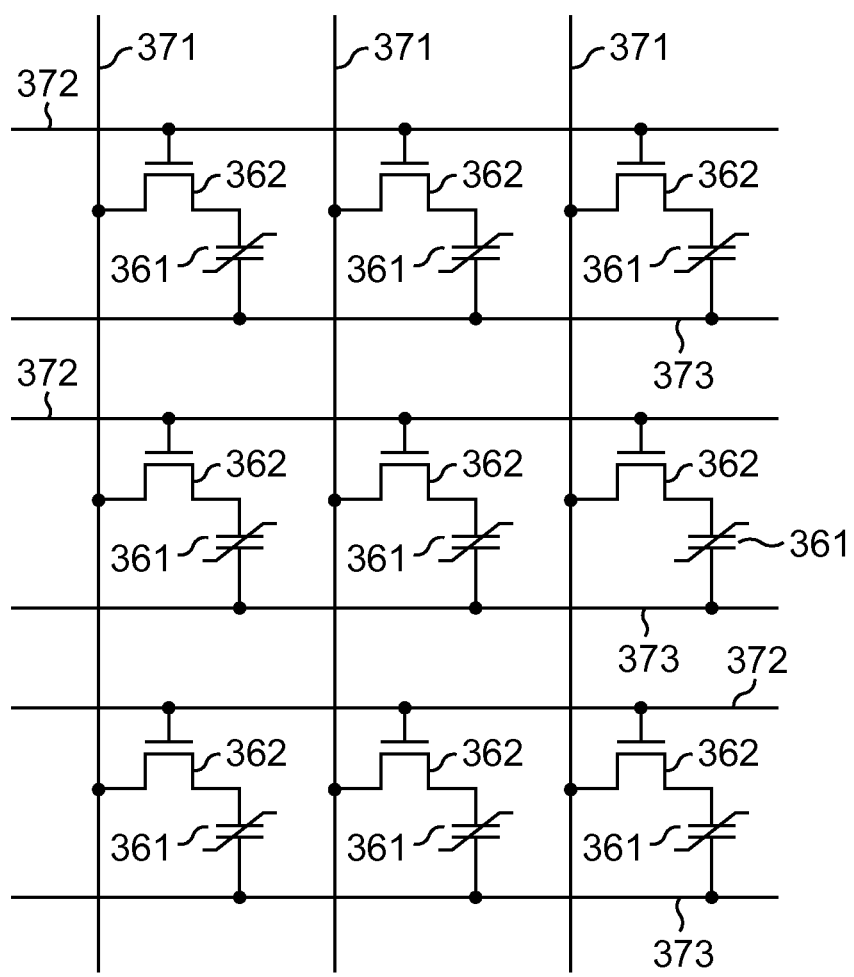
FIG. 6 is a diagram illustrating a configuration of a memory cell region in a third embodiment.
Figure 7A:
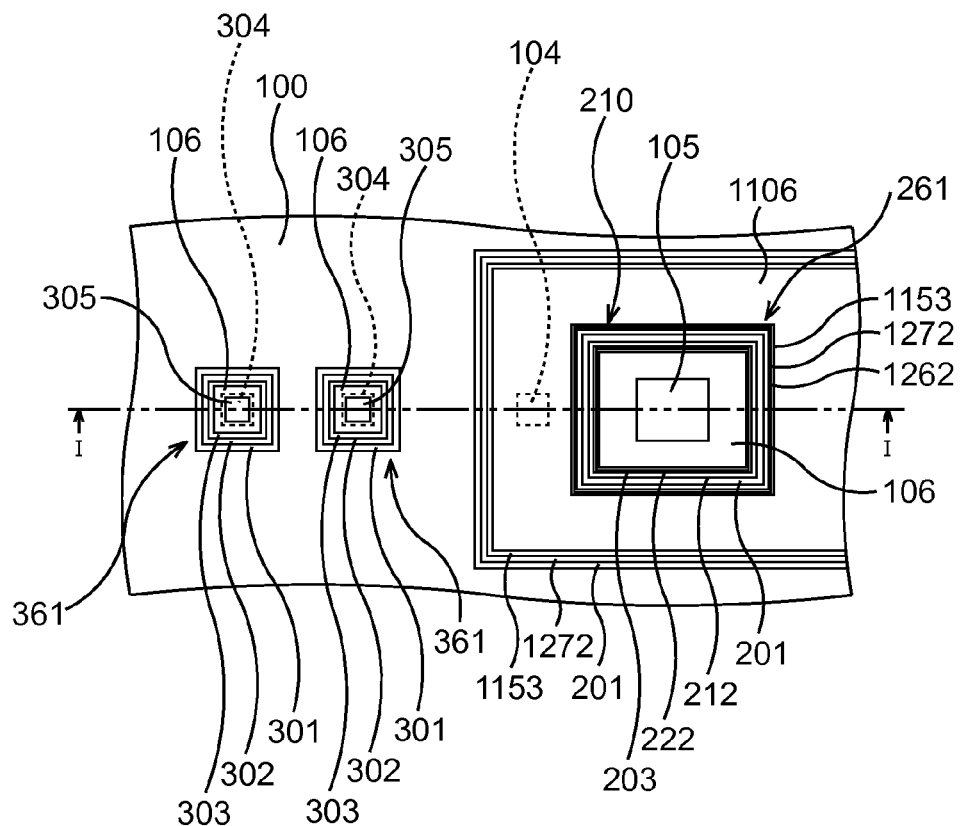
FIG. 7A is a plan diagram illustrating a configuration of a semiconductor device according to a third embodiment.
Figure 7B:
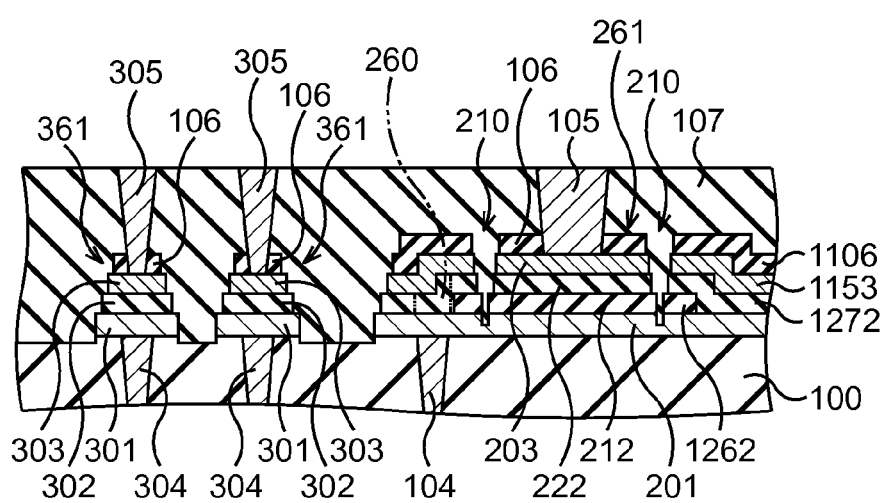
FIG. 7B is a cross-sectional diagram illustrating a configuration of the semiconductor device according to the third embodiment.

Next, a third embodiment will be described. The third embodiment is an example of a ferroelectric memory. FIG. 6 is a diagram illustrating a configuration of a memory cell region in the third embodiment. FIGS. 7A and 7B are a plan diagram and a cross-sectional diagram illustrating a configuration of a semiconductor device according to the third embodiment, respectively. FIG. 7A is a plan diagram, and FIG. 7B is a cross-sectional diagram taken along line I-I of FIG. 7A.

Similarly to the first embodiment, the semiconductor device according to the third embodiment also includes a memory cell region and a logic circuit region. The logic circuit region is connected to the memory cell region and includes a smoothing capacitor.

As illustrated in FIG. 6, a plurality of bit lines 371 extending in one direction are disposed in the memory cell region, and a plurality of word lines 372 and a plurality of plate lines 373 which intersect the bit lines 371 are also disposed. A plurality of memory cells are arranged in an array so as to match with lattices configured by the bit lines 371, the word lines 372, and the plate lines 373. Each memory cell includes a memory capacitor 361 and a memory transistor 362. A metal-oxide-semiconductor (MOS) field effect transistor is used as the memory transistor 362, for example.

A gate of the memory transistor 362 is connected to the word line 372. The one of a source and a drain of the memory transistor 362 is connected to the bit line 371, and the other is connected to the one electrode of the memory capacitor 361. The other electrode of the memory capacitor 361 is connected to the plate line 373. The word lines 372 and the plate lines 373 are shared through a plurality of the memory cells aligned in the same direction as the extension direction of the line. Similarly, bit lines 371 are shared through a plurality of the memory cells aligned in the same direction as the extension direction of the line. The arrangement of the bit lines 371, the word lines 372, and the plate lines 373 is not limited to the above-described arrangement.

Data is stored in the memory cell region of the ferroelectric memory having the above-described configuration according to a polarization state of a capacitor insulating film included in the memory capacitor 361.

As illustrated in FIGS. 7A and 7B, in the memory cell region, a bottom electrode 301 is formed on the base 100 such as an interlayer insulating film, a capacitor insulating film 302 is formed on the bottom electrode 301, and an top electrode 303 is formed on the capacitor insulating film 302. In this manner, the memory capacitors 361 are formed on the base 100. For the convenience, only two memory capacitors 361 are illustrated in FIGS. 7A and 7B. The bottom electrode 301 is an example of a second bottom electrode, the capacitor insulating film 302 is an example of a fourth insulating film; and the top electrode 303 is an example of a second top electrode.

As illustrated in FIGS. 7A and 7B, the smoothing capacitor 261 in the second embodiment is disposed in the logic circuit region. A thickness of the upper capacitor insulating film 222 is substantially the same as a thickness of the capacitor insulating film 302, an area of the top electrode 203 is larger than an area of the top electrode 303, and the lower capacitor insulating film 212 is thicker than each of the capacitor insulating film 302 and the upper capacitor insulating film 222. A capacitance of the smoothing capacitor 261 is larger than a capacitance of the memory capacitor 361.

At the outside of the groove 210, a contour of the pseudo upper capacitor insulating film 1272 is at the outside of a contour of the pseudo lower capacitor insulating film 1262, and a part of a lower surface of the pseudo upper capacitor insulating film 1272 is in contact with the bottom electrode 201.

The interlayer insulating film 107 which covers the memory capacitor 361 and the smoothing capacitor 261 is formed above the base 100. The conductive plug 105 which is in contact with the top electrode 203 and a conductive plug 305 which is in contact with the top electrode 303 are formed in the interlayer insulating film 107. In FIG. 7A, the interlayer insulating film 107 is omitted in illustration.

In the third embodiment having the configuration described above, the capacitor insulating film 302 exists between the bottom electrode 301 and the top electrode 303 in the memory capacitor 361, and the lower capacitor insulating film 212 besides the upper capacitor insulating film 222 exists between the bottom electrode 201 and the top electrode 203 in the smoothing capacitor 261. Thus, it is possible to allow the capacitor insulating film 302 to have a thickness preferable for a low voltage operation and to allow the lower capacitor insulating film 212 to have a thickness preferable for reducing a leakage current. Since the thickness of the upper capacitor insulating film 222 is substantially the same as the thickness of the capacitor insulating film 302, and the contour of the pseudo upper capacitor insulating film 1272 is at the outside of the contour of the pseudo lower capacitor insulating film 1262 at the outside of the groove 210, it is possible to complete the etching of the capacitor insulating film 302 and the etching of the pseudo upper capacitor insulating film 1272 in an equivalent time in manufacturing the device. Namely, it is possible to suppress deterioration in characteristics according to over-etching.

Since the memory cell region and the logic circuit region are disposed in the semiconductor device and the logic circuit region includes the smoothing capacitor 261, it is unnecessary to secure a region for a smoothing capacitor outside the memory cell region and the logic circuit region. While obtaining the effects, it is possible to suppress an increase in production cost and deterioration in performance of the memory capacitor, and it is possible to reduce a chip size.

In order to more accurately complete the etching of the capacitor insulating film 302 and the etching of the pseudo upper capacitor insulating film 1272 in an equivalent time, it is preferable that a distance between the contour of the pseudo upper capacitor insulating film 1272 and the contour of the pseudo lower capacitor insulating film 1262 be set to two times or more the thickness of the pseudo upper capacitor insulating film 1272. Namely, for example, if a thickness of the pseudo upper capacitor insulating film 1272 is 100 nm, it is preferable that the contour of the pseudo upper capacitor insulating film 1272 be spaced apart from the contour of the pseudo lower capacitor insulating film 1262 by 200 nm or more.

In general, an electrostatic capacitance Q (F) of a parallel plate capacitor is proportional to an area S (m²) of electrode plates and inversely proportional to a distance D (m) between the electrode plates. When a dielectric constant of vacuum is denoted by $\in_0$ (=8.854×10$^{-12}$ (F/m)) and a relative dielectric constant of a material constituting a capacitor insulating film is denoted by $\in_r$, the electrostatic capacitance Q (F) may be expressed by the following Formula 1.

$$Q = \in_0 \times \in_r \times (S/D) \quad \text{(Formula 1)}$$

By comparing an electrostatic capacitance Q1 of a smoothing capacitor of a transistor gate structure using a silicon oxide film as the capacitor insulating film with an electrostatic capacitance Q2 of the smoothing capacitor 261 according to the third embodiment, the following result is obtained. Here, the relative dielectric constant $\in_r$ of the silicon oxide film is 3.5, and the relative dielectric constant $\in_r$ of PZT is about 1400. In general, under a design rule that a gate length of a transistor is 0.18 μm, the distance D is in a range of 2.5 nm to 5 nm, and here, it is assumed that the shortest distance 2.5 nm is used. The distance D of the smoothing capacitor 261 according to the third embodiment is a sum of the thickness of the lower capacitor insulating film 212 and the thickness of the upper capacitor insulating film 222 and is, for example, 175 nm. The electrostatic capacitance Q1 and the electrostatic capacitance Q2 are obtained as follows.

$$Q1 = 8.854 \times 10^{-12} \times 3.5 \times (S/2.5 \times 10^{-9}) = 1.24 \times 10^{-2} \times S$$

$$Q2 = 8.854 \times 10^{-12} \times 1400 \times (S/175 \times 10^{-9}) = 7.08 \times 10^{-2} \times S$$

In this manner, according to the third embodiment, it is possible to obtain a sufficiently high electrostatic capacitance in comparison with the smoothing capacitor in the transistor gate structure. Therefore, even though the semiconductor device is further miniaturized, it is possible to represent sufficient characteristics.

Although the lower capacitor insulating film 212 and the upper capacitor insulating film 222 included in the smoothing capacitor 261 have polarization characteristics of a ferroelectric material, it is possible to use the smoothing capacitor within a range where the smoothing characteristics of the smoothing capacitor 261 are not influenced by the polarization characteristics. This is because a voltage applied to the smoothing capacitor 261 is relatively high in general.

The memory capacitor 361 is lower than the smoothing capacitor 261, and a voltage applied between the top electrode 303 and the bottom electrode 301 is much lower than a voltage applied between the top electrode 203 and the bottom electrode 201. Thus, even if a heterogeneous region is in the capacitor insulating film 302, a leakage current through the heterogeneous region as a path is very small.

Next, a method of manufacturing the semiconductor device according to the third embodiment will be described. FIGS. 8A to 8K are cross-sectional diagrams illustrating a procedure of processes of the method of manufacturing the semiconductor device according to the third embodiment.

Figure 8A:
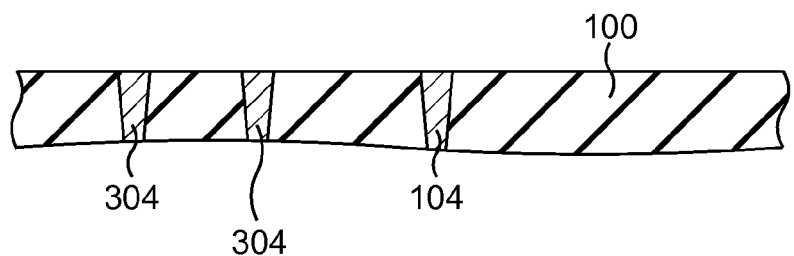
FIGS. 8A to 8K are cross-sectional diagrams illustrating a procedure of processes of a method of manufacturing the semiconductor device according to the third embodiment.

First, as illustrated in FIG. 8A, similarly to the first embodiment, the base 100 is formed. Then, contact holes are formed in the base 100 by etching using a CF$_4$ series gas, a C$_2$F$_6$ series gas, or a C$_4$F$_8$ series gas, and the conductive plug 104 and the conductive plug 304 are formed in the contact holes. The conductive plug 104 and the conductive plug 304 may be formed by burying a metal film such as a tungsten film in contact holes by a CVD method or the like, for example.

Figure 8B:
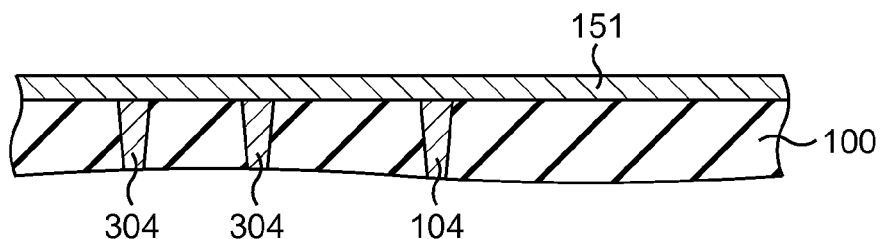
Figure 8C:
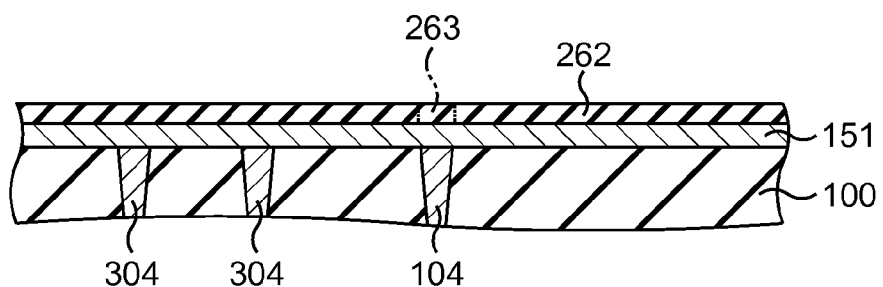
Figure 8D:
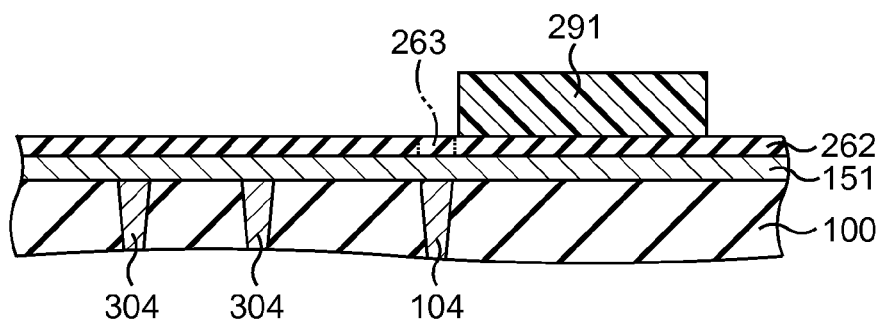
Figure 8E:
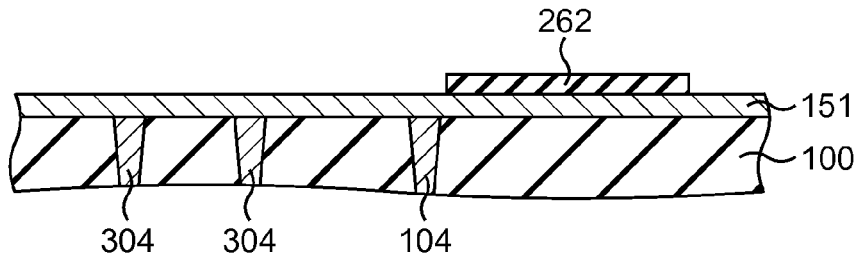
Figure 8F:
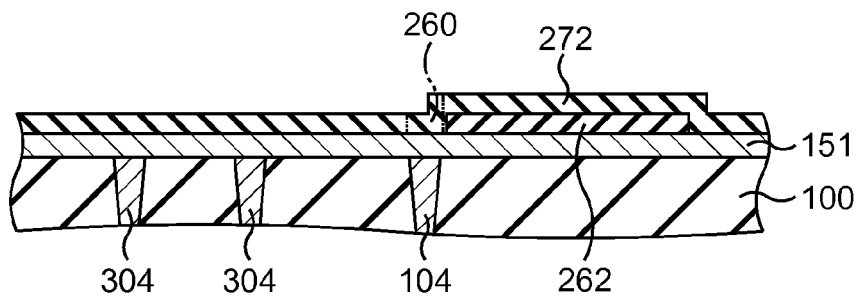
Figure 8G:
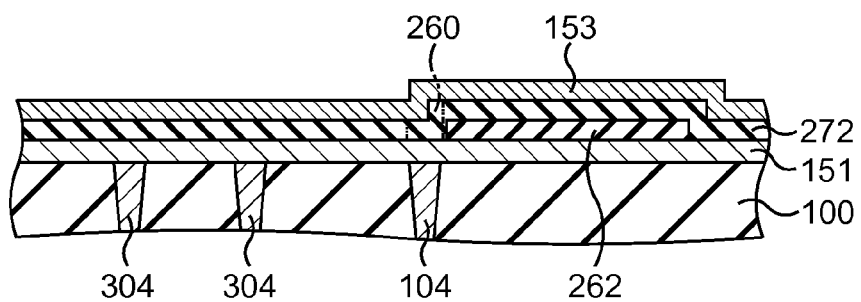
Figure 8H:
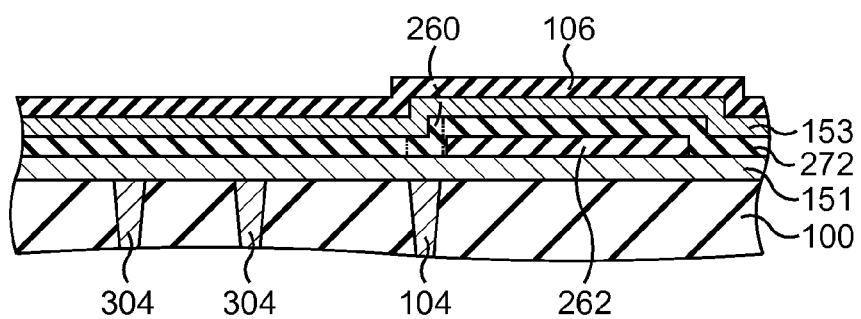

Thereafter, as illustrated in FIG. 8B, the conductive film 151 is formed so that parts of a lower surface thereof are in contact with the conductive plug 104 or the conductive plug 304, and as illustrated in FIG. 8C, the ferroelectric film 262 such as a PZT film is formed on the conductive film 151. Subsequently, as illustrated in FIG. 8D, a mask 291 which covers a region of the ferroelectric film 262 which is to be left, and exposes the other region is formed on the ferroelectric film 262, and as illustrated in FIG. 8E, the ferroelectric film 262 is etched. The mask 291 is removed. Then, as illustrated in FIG. 8F, the ferroelectric film 272 such as a PZT film which covers the ferroelectric film 262 is formed on the conductive film 151, and as illustrated in FIG. 8G, the conductive film 153 such as an iridium oxide film is formed on the ferroelectric film 272. Thereafter, as illustrated in FIG. 8H, the hard mask 106 is formed on the conductive film 153.

Figure 8I:
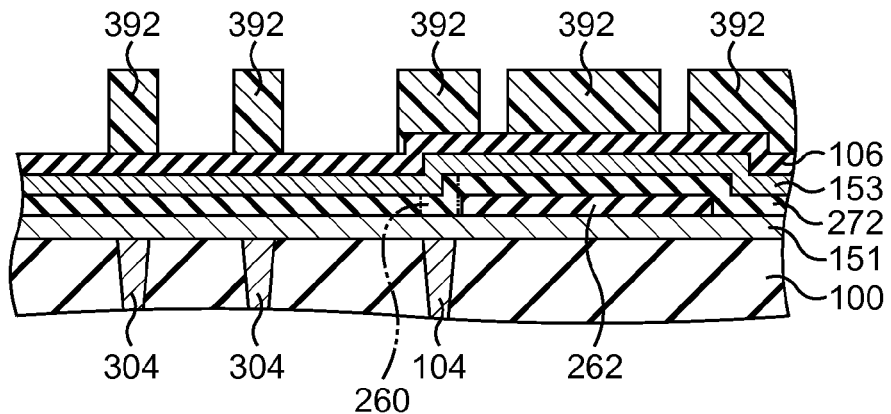

Subsequently, as illustrated in FIG. 8I, a mask 392 which covers a region of the hard mask 106 which is to be left and exposes the other region is formed on the hard mask 106. The mask 392 roughly covers a region where the bottom electrode 201 is to be formed and a region where the bottom electrode 301 is to be formed and exposes a region where the groove 210 is to be formed. A width of the region where the groove 210 is to be formed is about 60 nm. A mask of photoresist is formed as the mask 392, for example.

Figure 8J:
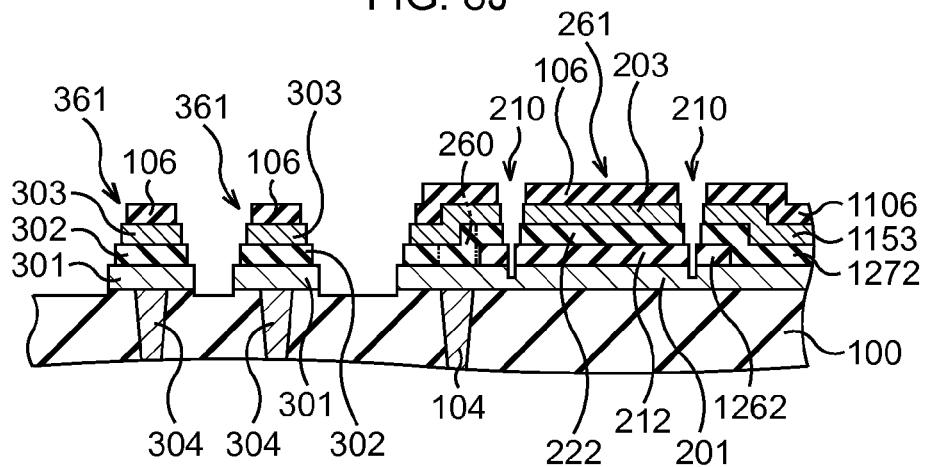

Then, as illustrated in FIG. 8J, the groove 210 having an annular plane shape and which reaches the inner portion of the conductive film 151 is formed by etching the hard mask 106, the conductive film 153, the ferroelectric film 272, the ferroelectric film 262, and the conductive film 151. As a result, the smoothing capacitor 261 including the top electrode 203, the upper capacitor insulating film 222, the lower capacitor insulating film 212, and the bottom electrode 201 is formed. The memory capacitor 361 including the top electrode 303, the capacitor insulating film 302, and the bottom electrode 301 is also formed by the etching. The pseudo hard mark 1106, the pseudo top electrode 1153, the pseudo upper capacitor insulating film 1272, and the pseudo lower capacitor insulating film 1262 are also formed. In a case where the mask 392 remains after the etching, the mask 392 is removed.

Figure 8K:
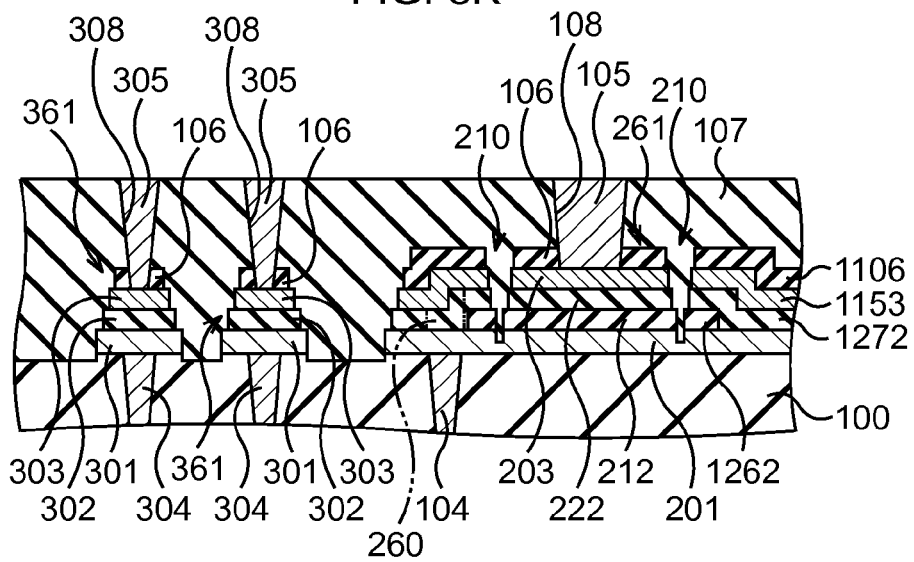

Thereafter, as illustrated in FIG. 8K, the interlayer insulating film 107 which covers the smoothing capacitor 261, the memory capacitor 361, and the like is formed above the base 100, and the opening 108 which reaches the top electrode 103 and an opening 308 which reaches the top electrode 303 are formed in the interlayer insulating film 107 and the hard mask 106. The conductive plug 105 is formed in the opening 108, and the conductive plug 305 is formed in the opening 308.

Then, upper layer wire lines, bonding pads, and the like are formed as necessary, and the semiconductor device is completed.

According to the manufacturing method, since it is possible to form the smoothing capacitor 261 together with the memory capacitor 361, it is possible to form the smoothing capacitor 261 in the logic circuit region. Therefore, a dedicated region required for a smoothing capacitor employing a transistor gate structure is unnecessary, and it is possible to reduce a chip size.

Fourth Embodiment

Next, a fourth embodiment will be described. The fourth embodiment is an example of a ferroelectric memory. FIGS.

Figure 9A:
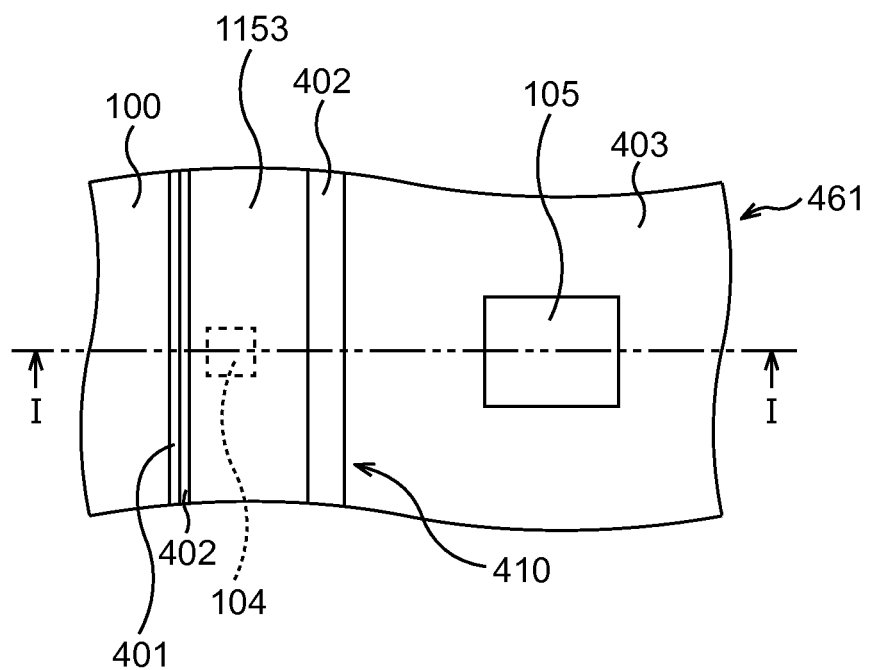
FIG. 9A is a plan diagram illustrating a configuration of a semiconductor device according to a fourth embodiment.

9A and 9B are a plan diagram and a cross-sectional diagram illustrating a configuration of a semiconductor device according to the fourth embodiment, respectively. FIG. 9A is a plan diagram, and FIG. 9B is a cross-sectional diagram taken along line I-I of FIG. 9A.

Similarly to the first embodiment, the semiconductor device according to the fourth embodiment also includes a memory cell region and a logic circuit region. The logic circuit region is connected to the memory cell region and includes a smoothing capacitor.

Figure 9B:
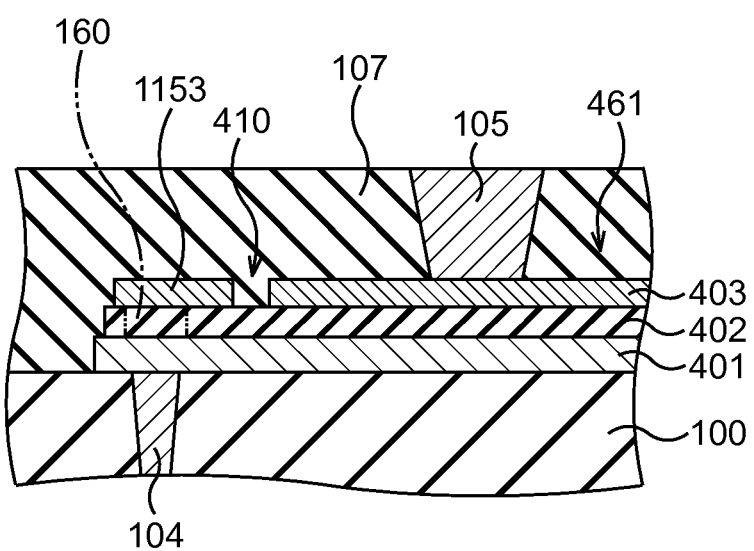
FIG. 9B is a cross-sectional diagram illustrating a configuration of the semiconductor device according to the fourth embodiment.

As illustrated in FIGS. 9A and 9B, in the fourth embodiment, a smoothing capacitor 461 includes a bottom electrode 401 on the base 100 such as an interlayer insulating film, a capacitor insulating film 402 on the bottom electrode 401, and an top electrode 403 on the capacitor insulating film 402. The conductive plug 104 is formed in the base 100, and a part of a lower surface of the bottom electrode 401 is in contact with the conductive plug 104. The pseudo top electrode 1153 including a portion immediately above the conductive plug 104 is also formed on the capacitor insulating film 402 besides the top electrode 403. The top electrode 403 is electrically insulated from the pseudo top electrode 1153 by a groove 410. The interlayer insulating film 107 which covers the top electrode 403 and the like is formed above the base 100, and the conductive plug 105 which is in contact with the top electrode 403 is formed in the interlayer insulating film 107. In FIG. 9A, the interlayer insulating film 107 is omitted in illustration.

In the smoothing capacitor 461, as described in detail later, although the heterogeneous region 160 which occurs at during formation of the capacitor insulating film 402 caused by a difference in material between the base 100 and the conductive plug 104 exists immediately above and in the vicinity of the conductive plug 104, a heterogeneous region does not exist in a portion spaced apart therefrom. Namely, the heterogeneous region 160 exists in a part of the capacitor insulating film 402 between the bottom electrode 401 and the pseudo top electrode 1153, and a heterogeneous region does not exists in a part between the bottom electrode 401 and the top electrode 403. The top electrode 403 is electrically insulated from the pseudo top electrode 1153. Thus, similarly to the smoothing capacitor 161, in the smoothing capacitor 461, it is possible to suppress a leakage current occurring in a stacked capacitor such as a smoothing capacitor in a related art.

Next, a method of manufacturing the semiconductor device according to the fourth embodiment will be described. FIGS. 10A to 10F are cross-sectional diagrams illustrating a procedure of processes of the method of manufacturing the semiconductor device according to the fourth embodiment.

Figure 10A:
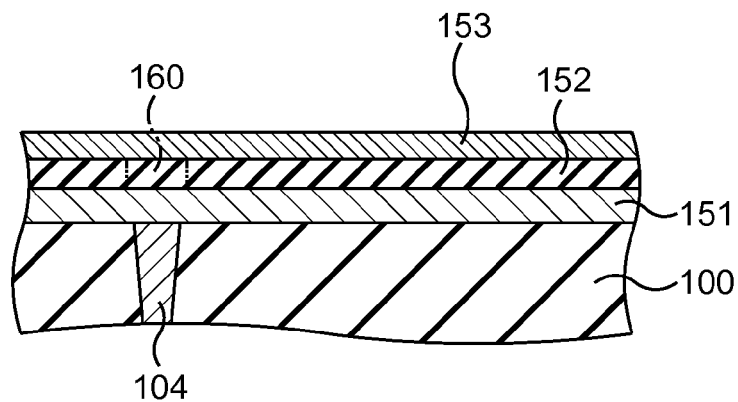
FIGS. 10A to 10F are cross-sectional diagrams illustrating a procedure of processes of a method of manufacturing the semiconductor device according to the fourth embodiment.

First, as illustrated in FIG. 10A, similarly to the first embodiment, the processes up to the formation of the conductive film 153 are performed.

Figure 10B:
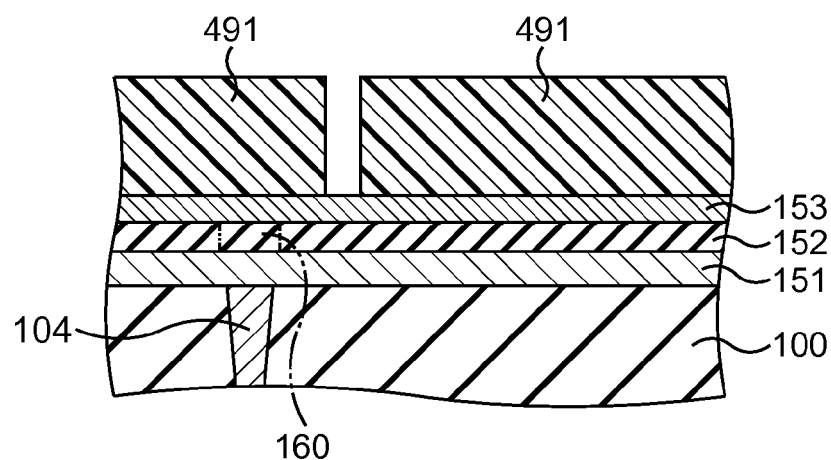

Then, as illustrated in FIG. 10B, a mask 491 which exposes a region where the groove 410 is to be formed and covers the other region is formed on the conductive film 153. A width of the region where the groove 410 is to be formed is about 60 nm. A mask of photoresist is formed as the mask 491, for example.

Figure 10C:
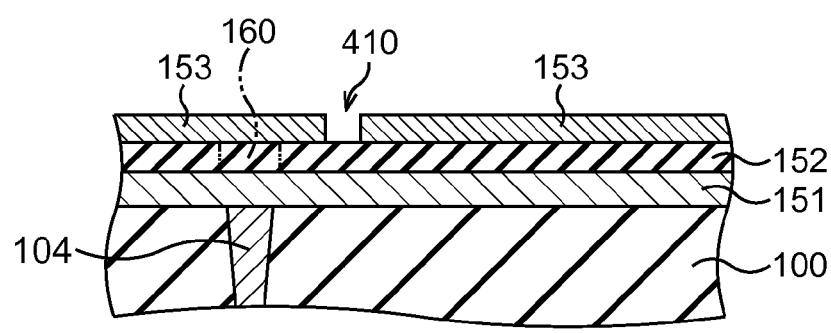

Thereafter, as illustrated in FIG. 10C, the groove 410 is formed in the conductive film 153 by etching the conductive film 153. A region of the conductive film 153 where the top electrode 403 is to be formed is electrically insulated from a region on the heterogeneous region 160 by the etching. In a case where the mask 491 remains after the etching, the mask 491 is removed.

Figure 10D:
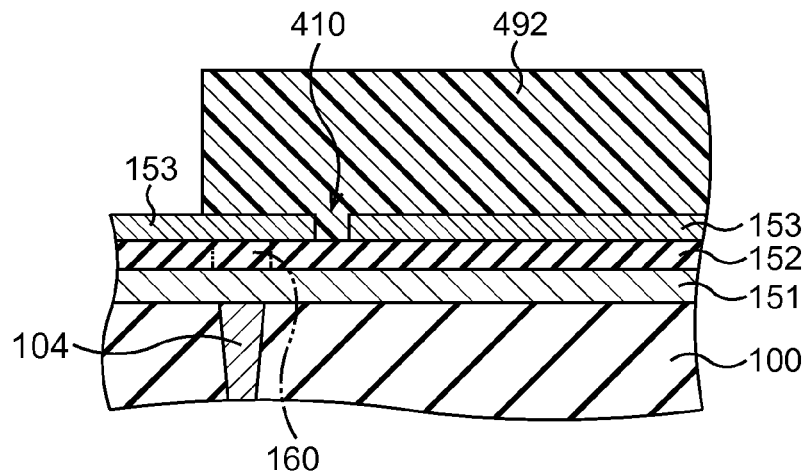

Subsequently, as illustrated in FIG. 10D, a mask 492 which covers a region of the conductive film 153 which is to be left including the region where the top electrode 403 is to be formed and exposes the other region is formed on the conductive film 153 and the ferroelectric film 152. The mask 492 roughly covers a region where the bottom electrode 301 is to be formed. A mask of photoresist is formed as the mask 492, for example.

Figure 10E:
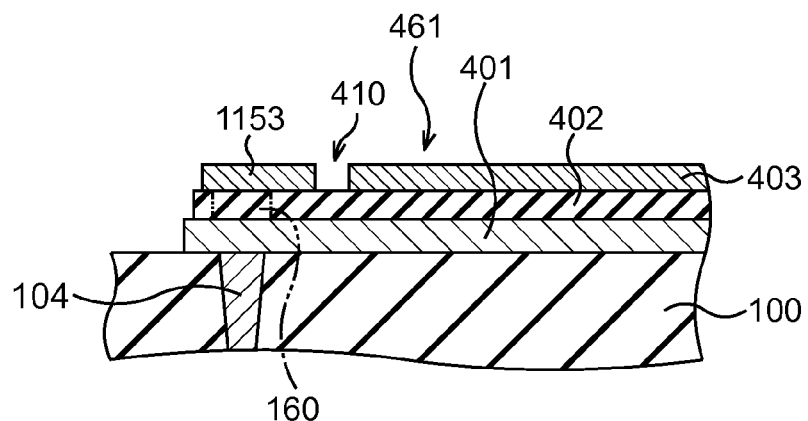

Then, as illustrated in FIG. 10E, the smoothing capacitor 461 including the top electrode 403, the capacitor insulating film 402, and the bottom electrode 401 is formed by etching the conductive film 153, the ferroelectric film 152, and the conductive film 151. The pseudo top electrode 1153 is also formed. In a case where the mask 492 remains after the etching, the mask 492 is removed.

Figure 10F:
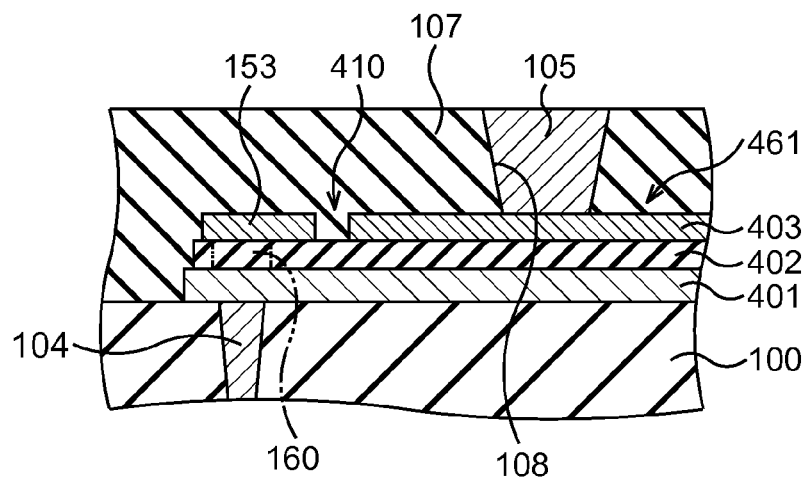

Subsequently, as illustrated in FIG. 10F, the interlayer insulating film 107 which covers the smoothing capacitor 461 and the like is formed above the base 100, and the opening 108 which reaches the top electrode 403 is formed in the interlayer insulating film 107, and the conductive plug 105 is formed in the opening 108.

Then, upper layer wire lines, bonding pads, and the like are formed as necessary, and the semiconductor device is completed.

According to this manufacturing method, although the capacitor insulating film 402 includes the heterogeneous region 160, where the leakage current easily flows, the top electrode 403 is electrically insulated from the pseudo top electrode 1153 on the heterogeneous region 160. Thus, a voltage between the top electrode 403 and the bottom electrode 401 is not applied to the heterogeneous region 160. Accordingly, although a voltage is applied between the top electrode 403 and the bottom electrode 401, it is possible to suppress the leakage current occurring in a stacked capacitor such as a smoothing capacitor of a related art.

Fifth Embodiment

Figure 11A:
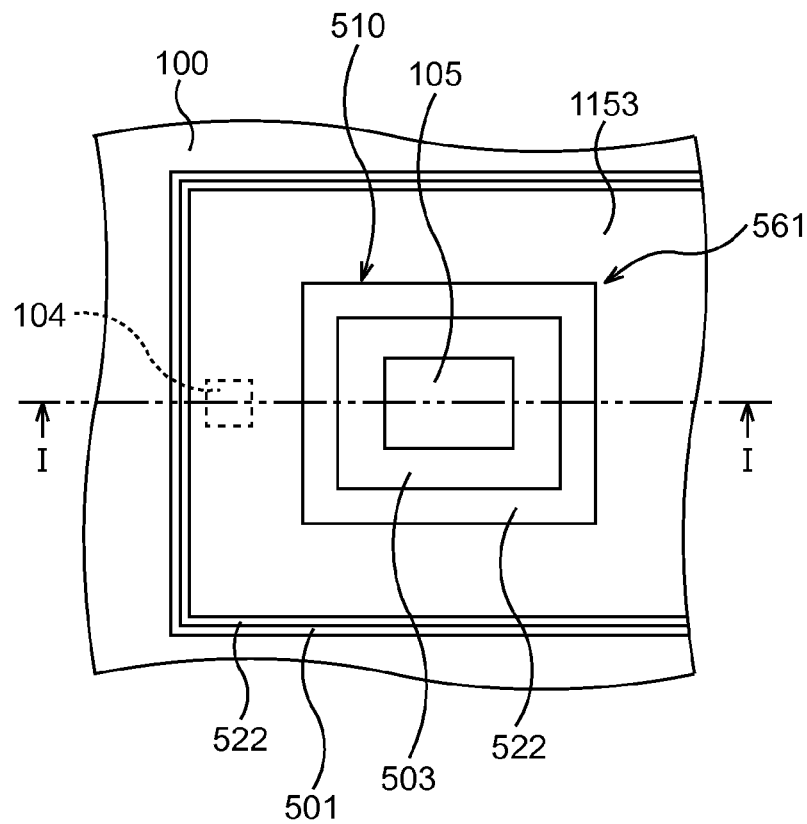
FIG. 11A is a plan diagram illustrating a configuration of a semiconductor device according to a fifth embodiment.
Figure 11B:
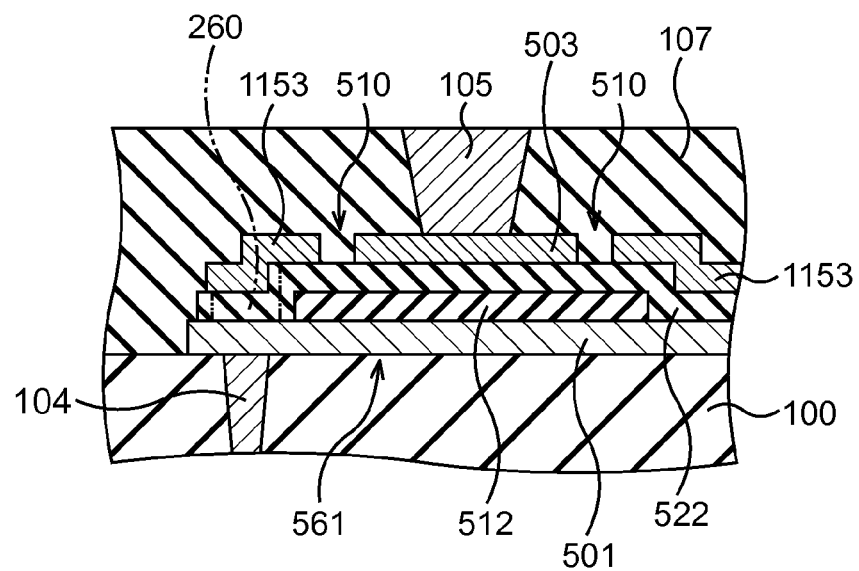
FIG. 11B is a cross-sectional diagram illustrating a configuration of the semiconductor device according to the fifth embodiment.

Next, a fifth embodiment will be described. The fifth embodiment is an example of a ferroelectric memory. FIGS. 11A and 11B are a plan diagram and a cross-sectional diagram illustrating a configuration of a semiconductor device according to the fifth embodiment, respectively. FIG. 11A is a plan diagram, and FIG. 11B is a cross-sectional diagram taken along line I-I of FIG. 11A.

Similarly to the first embodiment, the semiconductor device according to the fifth embodiment also includes a memory cell region and a logic circuit region. The logic circuit region is connected to the memory cell region and includes a smoothing capacitor.

As illustrated in FIGS. 11A and 11B, in the fifth embodiment, a smoothing capacitor 561 includes a bottom electrode 501 on the base 100 such as an interlayer insulating film, a lower capacitor insulating film 512 on the bottom electrode 501, an upper capacitor insulating film 522 on the lower capacitor insulating film 512, and an top electrode 503 on the upper capacitor insulating film 522. The conductive plug 104 is formed in the base 100, and a part of a lower surface of the bottom electrode 501 is in contact with the conductive plug 104. The pseudo top electrode 1153 including a portion immediately above the conductive plug 104 is also formed on the upper capacitor insulating film 522 besides the top electrode 503. The top electrode 503 is electrically insulated from the pseudo top electrode 1153 by a groove 510. For example, the groove 510 has an annular plane shape. The interlayer insulating film 107 which covers the top electrode 503 and the like is formed above the base 100, and the conductive plug 105 which is in contact with the top electrode 503 is formed in the interlayer insulating film 107. In FIG. 11A, the interlayer insulating film 107 is omitted in illustration.

In the smoothing capacitor 561, as described in detail later, although the heterogeneous region 260 which occurs during formation of the upper capacitor insulating film 522 caused by a difference in material between the base 100 and the conductive plug 104 exists immediately above and in the vicinity of the conductive plug 104, a heterogeneous region does not exist in a portion spaced apart therefrom. Namely, the heterogeneous region 260 exists in a part of the upper capacitor insulating film 522 between the bottom electrode 501 and the pseudo top electrode 1153, and a heterogeneous region does not exist in a portion between the bottom electrode 501 and the top electrode 503. The top electrode 503 is electrically insulated from the pseudo top electrode 1153. Thus, similarly to the smoothing capacitor 161, in the smoothing capacitor 561, it is possible to suppress a leakage current occurring in a stacked capacitor such as a smoothing capacitor in a related art.

Next, a method of manufacturing the semiconductor device according to the fifth embodiment will be described. FIGS. 12A to 12F are cross-sectional diagrams illustrating a procedure of processes of the method of manufacturing the semiconductor device according to the fifth embodiment.

Figure 12A:
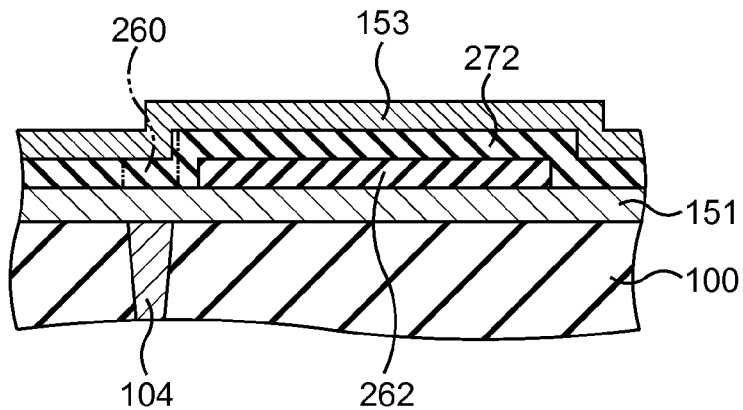
FIGS. 12A to 12F are cross-sectional diagrams illustrating a procedure of processes of a method of manufacturing the semiconductor device according to the fifth embodiment.

First, as illustrated in FIG. 12A, similarly to the second embodiment, the processes up to the formation of the conductive film 153 are performed.

Figure 12B:
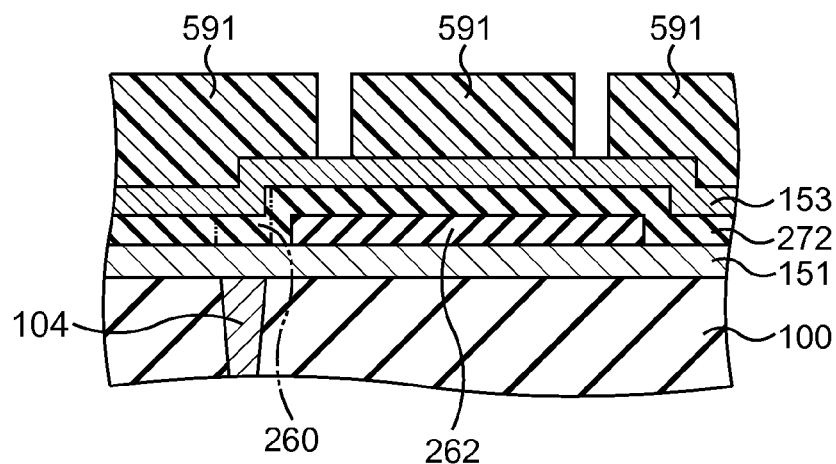

Then, as illustrated in FIG. 12B, a mask 591 which exposes a region where the groove 510 is to be formed and covers the other region is formed on the conductive film 153. A width of the region where the groove 510 is to be formed is about 60 nm. A mask of photoresist is formed as the mask 591, for example.

Figure 12C:
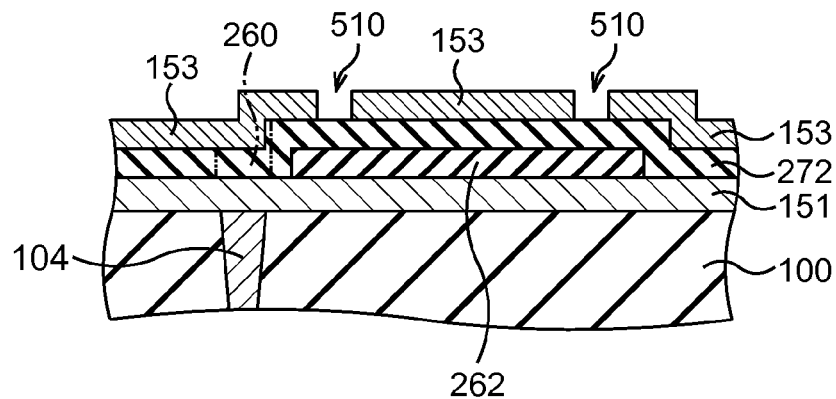

Next, as illustrated in FIG. 12C, the groove 510 having an annular plane shape is formed in the conductive film 153 by etching the conductive film 153. A region of the conductive film 153 where the top electrode 503 is to be formed is electrically insulated from a region on the heterogeneous region 260 by the etching. In a case where the mask 591 remains after the etching, the mask 591 is removed.

Figure 12D:
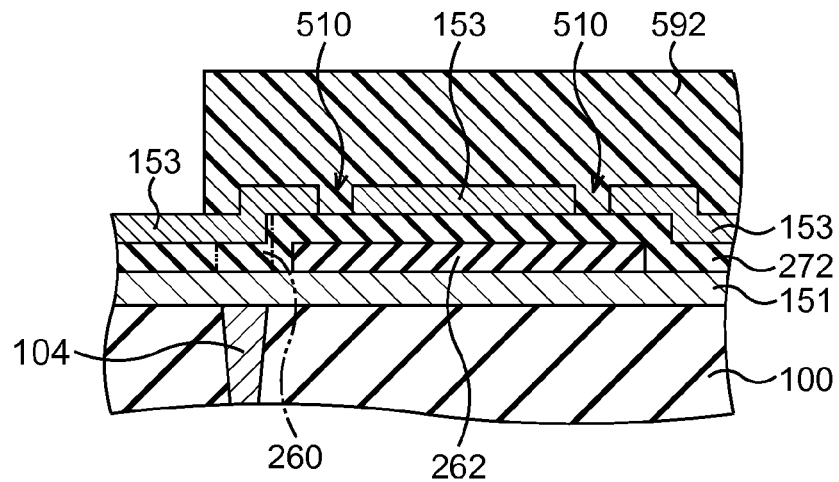

Subsequently, as illustrated in FIG. 12D, a mask 592 which covers a region of the conductive film 153 which is to be left including the region where the top electrode 503 is to be formed and exposes the other region is formed on the conductive film 153 and the ferroelectric film 272. The mask 592 roughly covers a region where the bottom electrode 501 is to be formed. A mask of photoresist is formed as the mask 592, for example.

Figure 12E:
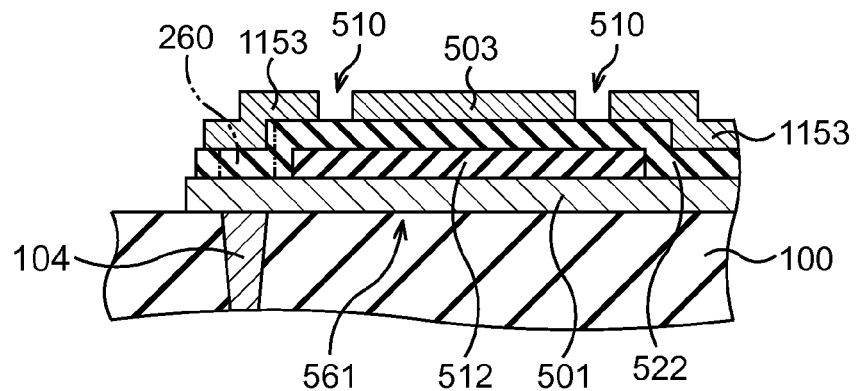

Then, as illustrated in FIG. 12E, the smoothing capacitor 561 including the top electrode 503, the upper capacitor insulating film 522, the lower capacitor insulating film 512, and the bottom electrode 501 is formed by etching the conductive film 153, the ferroelectric film 272, and the conductive film 151. The pseudo top electrode 1153 is also formed. In a case where the mask 592 remains after the etching, the mask 592 is removed.

Figure 12F:
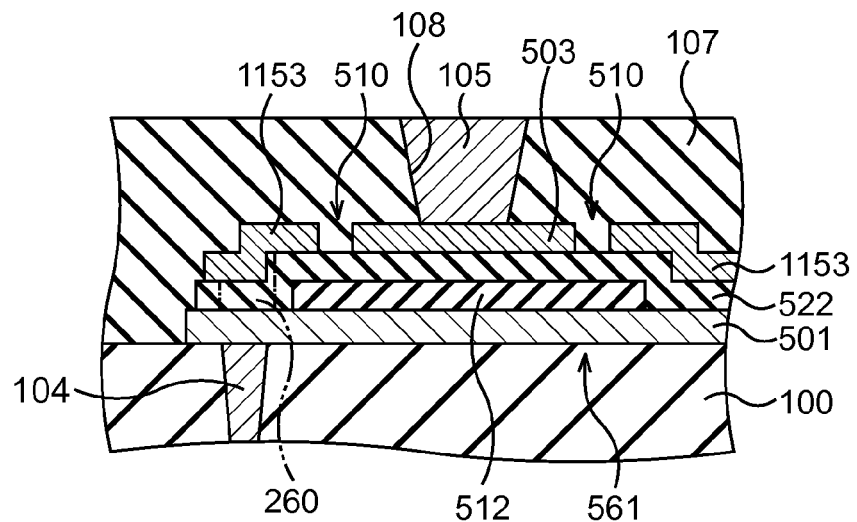

Subsequently, as illustrated in FIG. 12F, the interlayer insulating film 107 which covers the smoothing capacitor 561 and the like is formed above the base 100, and the opening 108 which reaches the top electrode 503 is formed in the interlayer insulating film 107, and the conductive plug 105 is formed in the opening 108.

Then, upper layer wire lines, bonding pads, and the like are formed as necessary, and the semiconductor device is completed.

According to this manufacturing method, although the upper capacitor insulating film 522 includes the heterogeneous region 260, where the leakage current easily flows, the top electrode 503 is electrically insulated from the pseudo top electrode 1153 on the heterogeneous region 260. Even in a case where the heterogeneous region 263, where the leakage current easily flows, remains in the pseudo lower capacitor insulating film 1262, the top electrode 503 is electrically insulated from the pseudo top electrode 1153 on the heterogeneous region 263. Thus, a voltage between the top electrode 503 and the bottom electrode 501 is not applied to the heterogeneous region 260 (and the heterogeneous region 263). Accordingly, although a voltage is applied between the top electrode 503 and the bottom electrode 501, it is possible to suppress the leakage current occurring in a stacked capacitor such as a smoothing capacitor of a related art.

Sixth Embodiment

Figure 13A:
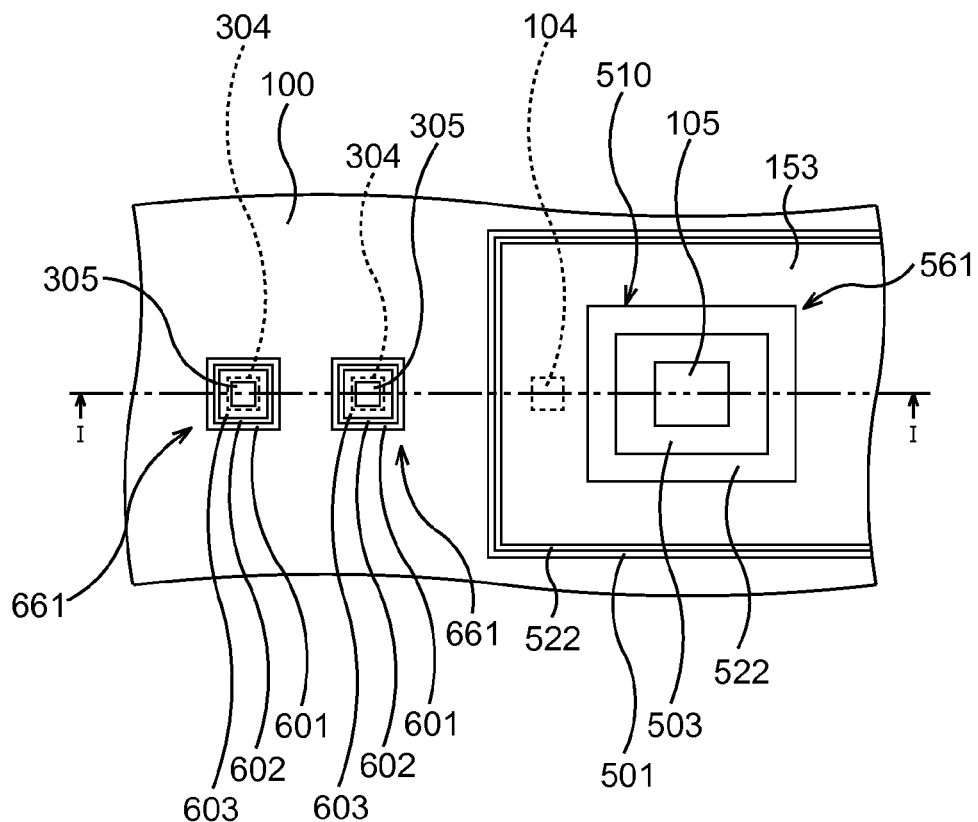
FIG. 13A is a plan diagram illustrating a configuration of a semiconductor device according to a sixth embodiment.
Figure 13B:
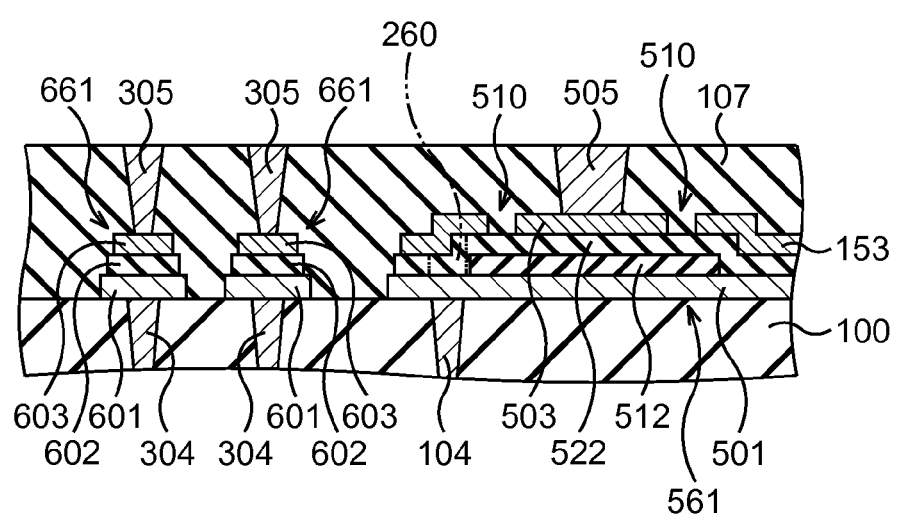
FIG. 13B is a cross-sectional diagram illustrating a configuration of the semiconductor device according to the sixth embodiment.

Next, a sixth embodiment will be described. The sixth embodiment is an example of a ferroelectric memory. FIGS. 13A and 13B are a plan diagram and a cross-sectional diagram illustrating a configuration of a semiconductor device according to the sixth embodiment, respectively. FIG. 13A is a plan diagram, and FIG. 13B is a cross-sectional diagram taken along line I-I of FIG. 13A.

Similarly to the first embodiment, the semiconductor device according to the sixth embodiment also includes a memory cell region and a logic circuit region. The logic circuit region is connected to the memory cell region and includes a smoothing capacitor.

As illustrated in FIGS. 13A and 13B, in the memory cell region, a bottom electrode 601 is formed on the base 100 such as an interlayer insulating film, a capacitor insulating film 602 is formed on the bottom electrode 601, and an top electrode 603 is formed on the capacitor insulating film 602. In this manner, memory capacitors 661 are formed on the base 100. In the sixth embodiment, instead of the memory capacitors 361, the memory capacitors 661 are disposed. For the convenience, only the two memory capacitors 661 are illustrated in FIGS. 13A and 13B. The bottom electrode 601 is an example of a second bottom electrode, the capacitor insulating film 602 is an example of a fourth insulating film, and the top electrode 603 is an example of a second top electrode.

As illustrated in FIGS. 13A and 13B, the smoothing capacitor 561 in the fifth embodiment is disposed in the logic circuit region. A thickness of the upper capacitor insulating film 522 is substantially the same as a thickness of the capacitor insulating film 602, an area of the top electrode 503 is larger than an area of the top electrode 603, the lower capacitor insulating film 512 is thicker than each of the capacitor insulating film 602 and the upper capacitor insulating film 522. A capacitance of the smoothing capacitor 561 is larger than a capacitance of the memory capacitor 661.

At the outside of the groove 510, a contour of the upper capacitor insulating film 522 is at the outside of a contour of the lower capacitor insulating film 512, and a part of a lower surface of the upper capacitor insulating film 522 is in contact with the bottom electrode 501.

The interlayer insulating film 107 which covers the memory capacitor 661 and the smoothing capacitor 561 is formed above the base 100. The conductive plug 105 which is in contact with the top electrode 503 and a conductive plug 305 which is in contact with the top electrode 603 are formed in the interlayer insulating film 107. In FIG. 13A, the interlayer insulating film 107 is omitted in illustration.

According to the sixth embodiment having the configuration described above, it is possible to obtain the same effects as those of the third embodiment and the same effects as those of the fifth embodiment.

Next, a method of manufacturing the semiconductor device according to the sixth embodiment will be described. FIGS. 14A to 14F are cross-sectional diagrams illustrating a procedure of processes of the method of manufacturing the semiconductor device according to the sixth embodiment.

Figure 14A:
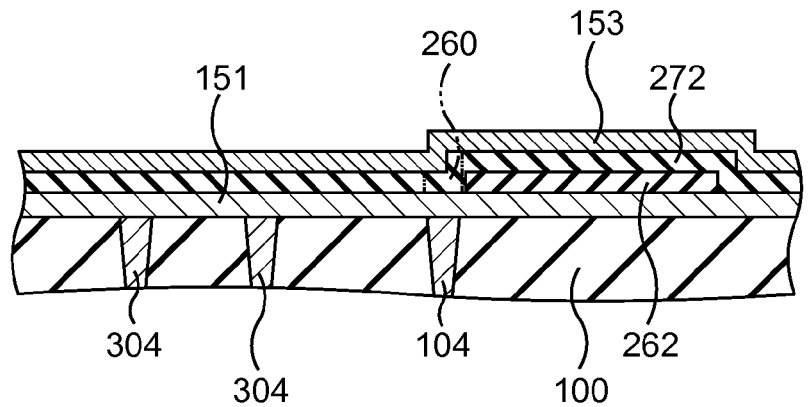
FIGS. 14A to 14F are cross-sectional diagrams illustrating a procedure of processes of a method of manufacturing the semiconductor device according to the sixth embodiment.

First, as illustrated in FIG. 14A, similarly to the third embodiment, the processes up to the formation of the conductive film 153 are performed.

Figure 14B:
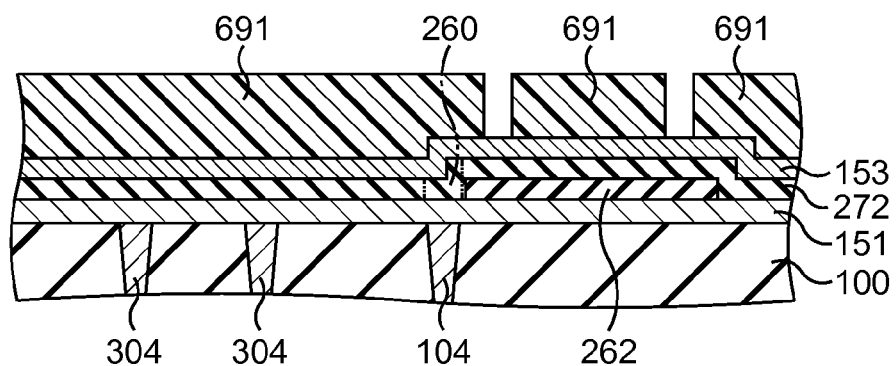

Next, as illustrated in FIG. 14B, a mask 691 which exposes a region where the groove 510 is to be formed and covers the other region is formed on the conductive film 153. A width of the region where the groove 510 is to be formed is about 60 nm. A mask of photoresist is formed as the mask 691, for example.

Figure 14C:
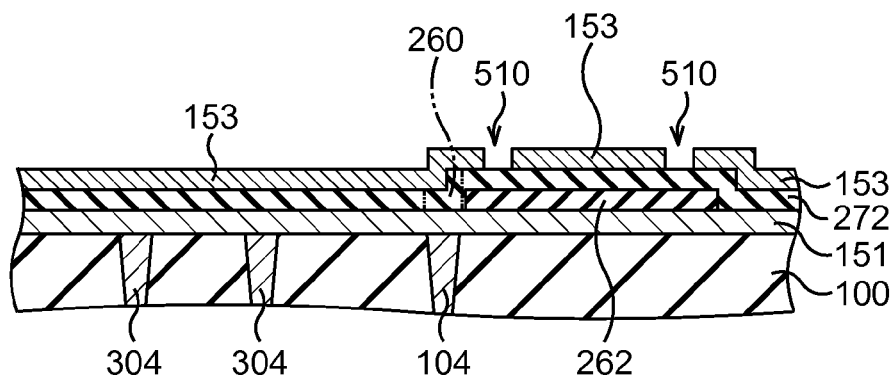

Thereafter, as illustrated in FIG. 14C, the groove 510 having an annular plane shape is formed in the conductive film 153 by etching the conductive film 153. A region of the conductive film 153 where the top electrode 503 is to be formed is electrically insulated from the region on the heterogeneous region 260 by the etching. In a case where the mask 691 remains after the etching, the mask 691 is removed.

Figure 14D:
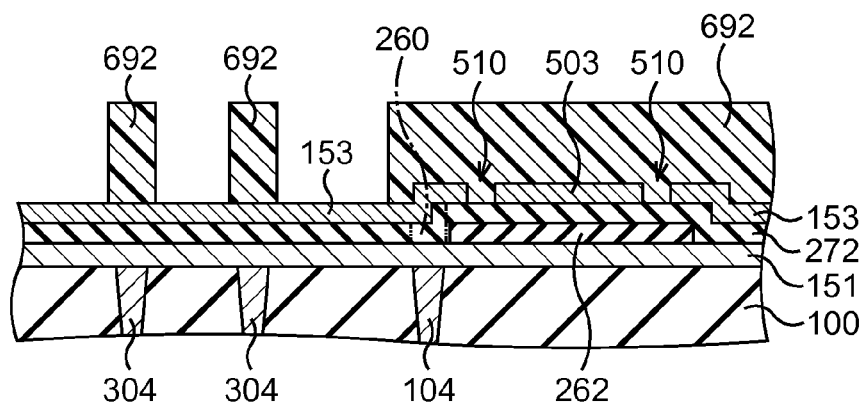

Subsequently, as illustrated in FIG. 14D, a mask 692 which covers a region of the conductive film 153 which is to be left including the region where the top electrode 503 is to be formed and exposes the other region is formed on the conductive film 153 and the ferroelectric film 272. The mask 692 roughly covers a region where the bottom electrode 501 is to be formed and a region where the bottom electrode 601 is to be formed. A mask of photoresist is formed as the mask 692, for example.

Figure 14E:
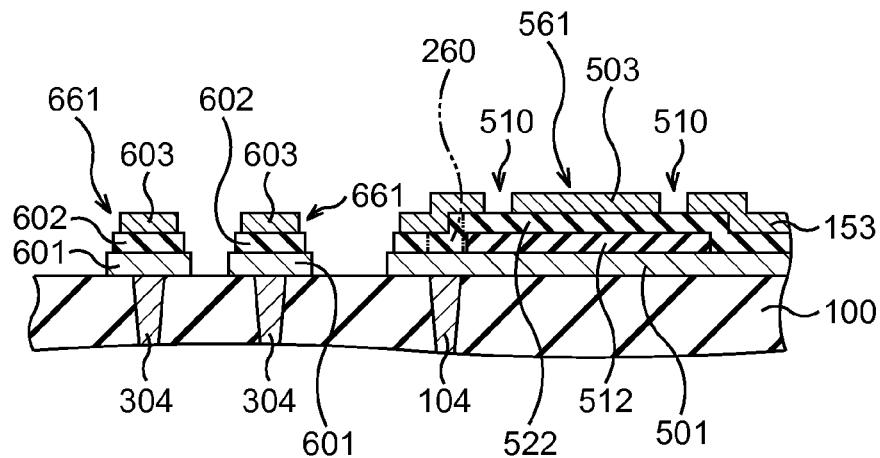

Then, as illustrated in FIG. 14E, the smoothing capacitor 561 including the top electrode 503, the upper capacitor insulating film 522, the lower capacitor insulating film 512, and the bottom electrode 501 is formed by etching the conductive film 153, the ferroelectric film 272, and the conductive film 151. The memory capacitor 661 including the top electrode 603, the capacitor insulating film 602, and the bottom electrode 601 is also formed by the etching. The pseudo top electrode 1153 is also formed. It is preferable that a distance between the contour of the upper capacitor insulating film 522 and the contour of the lower capacitor insulating film 512 be set to two times or more the thickness of the upper capacitor insulating film 522. This is because the etching of the capacitor insulating film 602 and the etching of the upper capacitor insulating film 522 are more accurately completed in an equivalent time. In a case where the mask 692 remains after the etching, the mask 692 is removed.

Figure 14F:
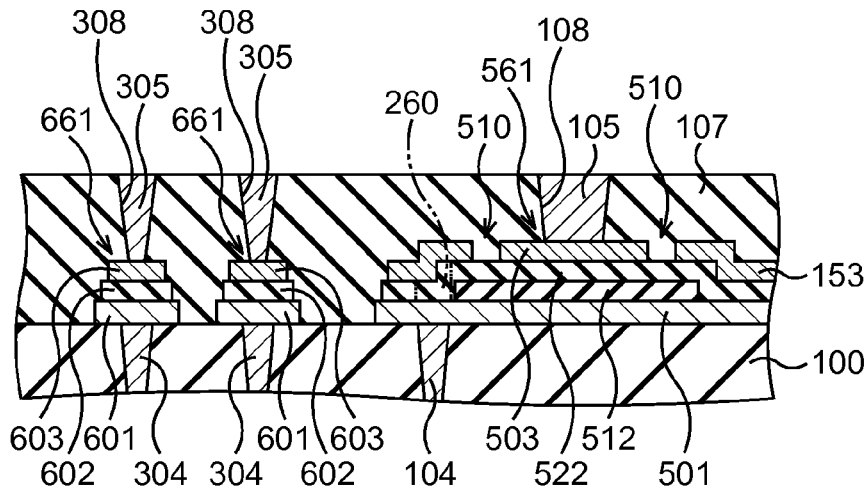

Thereafter, as illustrated in FIG. 14F, the interlayer insulating film 107 which covers the smoothing capacitor 561, the memory capacitor 661, and the like is formed above the base 100, and the opening 108 which reaches the top electrode 503 and the opening 308 which reaches the top electrode 603 are formed in the interlayer insulating film 107. Then, the conductive plug 105 is formed in the opening 108, and the conductive plug 305 is formed in the opening 308.

Then, upper layer wire lines, bonding pads, and the like are formed as necessary, and the semiconductor device is completed.

According to this manufacturing method, since it is possible to form the smoothing capacitor 561 together with the memory capacitor 661, it is possible to form the smoothing capacitor 561 in the logic circuit region. Therefore, a dedicated region required for a smoothing capacitor employing a transistor gate structure is unnecessary, and it is possible to reduce a chip size.

Figure 15:
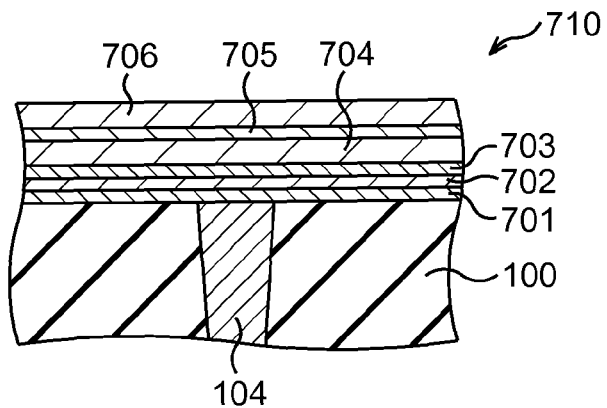
FIG. 15 is a cross-sectional diagram illustrating an example of a structure of a bottom electrode.

Here, a preferable structure of a bottom electrode will be described. FIG. 15 is a cross-sectional diagram illustrating an example of a structure of a bottom electrode.

The bottom electrode 710 includes a Ti film 701, a TiAlN film 702, a TiAlN film 703, an Ir film 704, an iridium oxide ($IrO_x$) film 705, and a Pt film 706 on the base 100. For example, a thickness of the Ti film 701 is about 20 nm or less, preferably, in a range of 5 nm to 10 nm. The Ti film 701 may function as a crystallinity-improved conductive adhesive film. For example, a thickness of the TiAlN film 702 is about 20 nm. The TiAlN film 702 may function as a first oxygen diffusion barrier film. For example, a thickness of the TiAlN film 703 is about 25 nm. The TiAlN film 703 may function as a second oxygen diffusion barrier film. For example, a thickness of the Ir film 704 is in a range of about 30 nm to 50 nm, a thickness of the $IrO_x$ film 705 is about 30 nm, and a thickness of the Pt film 706 is about 50 nm. A stacked body of the Ir film 704, the $IrO_x$ film 705 and the Pt film 706 may function as a bottom electrode main portion.

The bottom electrode 710 having the configuration described above has a function and effect in that a heterogeneous region is not easily generated in the ferroelectric film formed above the bottom electrode, and the bottom electrode may be used for the bottom electrode 101, 201, 401, or 501 according to the embodiments. In a case where the bottom electrode 710 is used for the bottom electrode 101, 201, 401, or 501, it is possible to further reduce a gap between the top electrode 103, 203, 403, or 503 and the conductive plug 104 in planar view. Further reducing the gap may further miniaturize the semiconductor device.

Figure 16A:
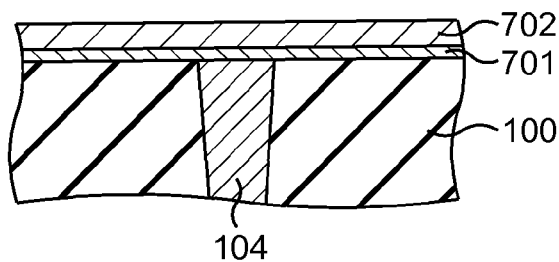
FIGS. 16A to 16C are cross-sectional diagrams illustrating a procedure of processes of a method of forming the bottom electrode.
Figure 16B:
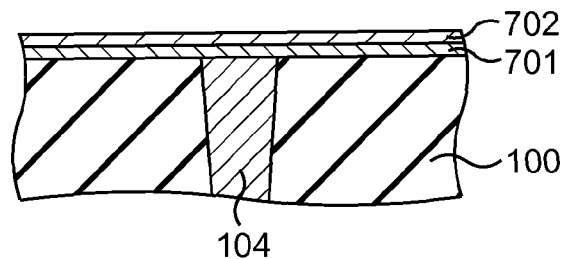
Figure 16C:
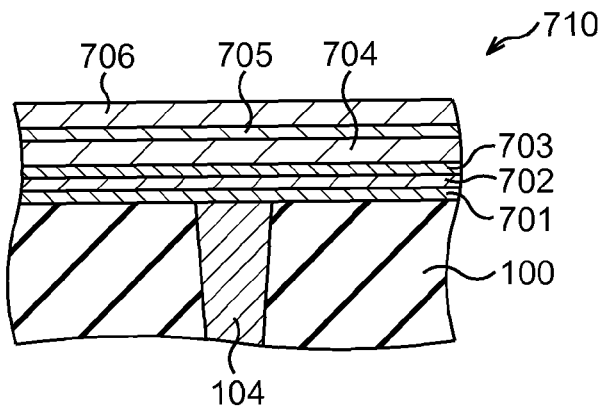

Next, a method of forming the bottom electrode 710 will be described. FIGS. 16A to 16C are cross-sectional diagrams illustrating a procedure of processes of the method of forming the bottom electrode.

First, as illustrated in FIG. 16A, the Ti film 701 and the TiAlN film 702 are formed on the base 100 and the conductive plug 104. For example, a thickness of the Ti film 701 is about 20 nm or less, preferably in a range of 5 nm to 10 nm, and a thickness of the TiAlN film 702 is about 40 nm. For example, the Ti film may be formed by a sputtering method, and the TiAlN film 702 may be formed by a reactive sputtering method using an alloy target of Ti and Al.

Then, as illustrated in FIG. 16B, the TiAlN film 702 is polished. The thickness of the polished TiAlN film 702 is about 20 nm. The polishing of the TiAlN film 702 may be performed by a chemical mechanical polishing (CMP) method.

Thereafter, as illustrated in FIG. 16C, the TiAlN film 703 whose thickness is about 25 nm is formed on the TiAlN film 702. The TiAlN film 703 may be formed by a reactive sputtering method using an alloy target of Ti and Al. The Ir film 704 whose thickness is in a range of about 30 nm to 50 nm is formed on the TiAlN film 703, the $IrO_x$ film 705 whose thickness is about 30 nm is formed on the Ir film 704, and the Pt film 706 whose thickness is about 50 nm is formed on the $IrO_x$ film 705. The Ir film 704, the $IrO_x$ film 705, and the Pt film 706 may be formed by a sputtering method. Subsequently, a thermal treatment is performed. Adhesiveness among the Ti film 701, the TiAlN film 702, the TiAlN film 703, the Ir film 704, the $IrO_x$ film 705, and the Pt film 706 is improved by the thermal treatment. The crystallinities of the Ir film 704, the $IrO_x$ film 705, and the Pt film 706 are improved by the thermal treatment, too. As the thermal treatment, for example, rapid thermal annealing (RTA) is performed at 650° C. or higher for 60 seconds in an argon atmosphere.

In this manner, the bottom electrode 710 may be formed.

Instead of the Ti film 701, an Ir film, a Pt film, a Pd film, a Rh film, a Ta film, an Os film, or a Ru film may be used. These films are easily oriented to the (111) plane. A thermal treatment may be performed before the formation of the TiAlN film 702. For example, the RTA may be performed at 650° C. for 60 seconds in a nitrogen atmosphere. Instead of the TiAlN film 702, a titanium aluminum oxynitride (TiAlON) film, a tantalum aluminum nitride (TaAlN) film, a tantalum aluminum oxynitride (TaAlON) film, a hafnium aluminum nitride (HfAlN) film, a hafnium aluminum oxynitride (HfAlON) film, an iridium silicon nitride (IrSiN) film, an iridium silicon oxynitride (IrSiON) film, an iridium aluminum nitride (IrAlN) film, an iridium aluminum oxynitride (IrAlON) film, a ruthenium silicon nitride (RuSiON) film, a ruthenium silicon oxynitride (RuSiON) film, or an arbitrary combination thereof may be used. A planarization process using the CMP may be easily performed on these films. Instead of the TiAlN film 703, a TiAlON film, a TaAlN film, a TaAlON film, a HfAlN film, a HfAlON film, an IrSiN film, an IrSiON film, an IrAlN film, an IrAlON film, a RuSiN film, a RuSiON film, an Ir film, a Ru film, a TiN film, a tantalum nitride (TaN) film, a hafnium nitride (HfN) film, or any combination thereof may be used. Instead of the stacked body of the Ir film 704, the $IrO_x$ film 705, and the Pt film 706, an Ir film, a Ru film, a Pt film, a Pd film, an Os film, a Rh film, a platinum oxide ($PtO_x$) film, an iridium oxide ($IrO_x$) film, a strontium ruthenium oxide ($SrRuO_3$) film, a ruthenium oxide ($RuO_x$) film, a palladium oxide ($PdO_x$) film, an osmium oxide ($OsO_x$) film, or a rhodium oxide ($RhO_x$) film may be used. A stacked body of any combination of these films may be used. For example, a stacked body such as $Pt/IrO_x/Ir$, $Pt/IrO_x/IrO_y/Ir$, $Pt/SrRuO_3/IrO_x/Ir$, $Pt/PtO_x/IrO_x/Ir$, or $Pt/IrO_x/RuO_x/Ir$ may be used. Here, the notation "A/B" denotes that an A film exists on a B film. A resistivity of the first oxygen diffusion barrier film is preferably 400 µΩ·cm or more, and a resistivity of the second oxygen diffusion barrier film is preferably 1200 µΩ·cm or less.

Figure 17A:
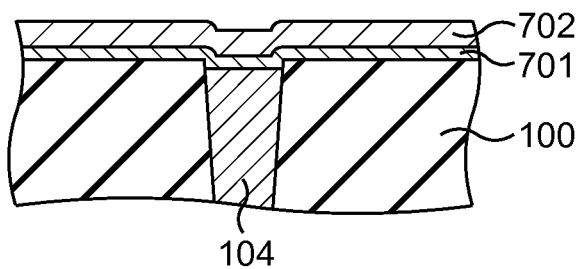
FIGS. 17A to 17C are cross-sectional diagrams illustrating an example of application of the bottom electrode.
Figure 17B:
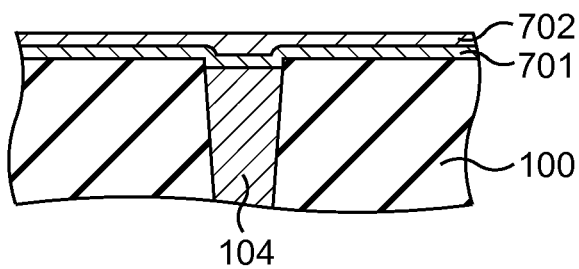
Figure 17C:
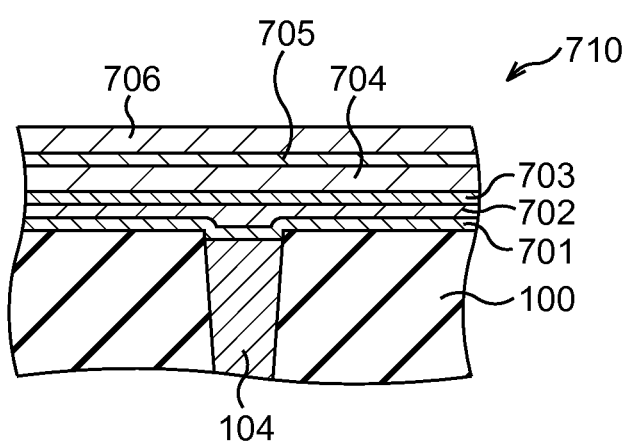

Particularly, the bottom electrode 710 is preferable for a case where the upper surface of the conductive plug 104 is located at a position lower than the upper surface of the base 100. In this case, as illustrated in FIG. 17A, after the formation of the Ti film 701 and the TiAlN film 702, a step difference between the conductive plug 104 and the base 100 appears in the upper surface of the TiAlN film 702. However, by the polishing of the TiAlN film 702, as illustrated in FIG. 17B, the upper surface of the TiAlN film 702 is made flat, so that the step difference disappears. Thus, the next formed films, that is, the TiAlN film 703, the Ir film 704, the $IrO_x$ film 705, and the Pt film 706 are also planarized.

A ferroelectric material used for the ferroelectric capacitor is not limited to the PZT, and a PZT added with La, Ca, or the like may be used. Bismuth titanate or the like may be used. The memory capacitor is not limited to the ferroelectric capacitor, but for example, a high dielectric memory capacitor or a paraelectric memory capacitor may be used. The high dielectric memory capacitor and the paraelectric memory capacitor may be used for a dynamic random access memory (DRAM), for example. It is possible to obtain the same effect by applying the same structure as that of the smoothing capacitor according to each embodiment to a protection capacitor in a protection circuit region of a semiconductor element such as a transistor.

According to the semiconductor devices and the like described above, since an appropriate top electrode is included, it is possible to suppress a leaking current of a smoothing capacitor.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a semiconductor substrate;
   a base above the semiconductor substrate;
   a first conductive plug in the base;
   a memory cell region in the base; and
   a logic circuit region connected to the memory cell region, the logic circuit comprising a first capacitor,
   wherein
   the first capacitor comprises:
      a first bottom electrode, a part of a lower surface of the first bottom electrode being in contact with the first conductive plug;
      a first insulating film on the first bottom electrode; and
      a first top electrode on the first insulating film,
   the first top electrode is spaced apart from the first conductive plug in planar view,
   the memory cell region comprises a second capacitor,
   the second capacitor comprises:
      a second bottom electrode, a part of a lower surface of the second bottom electrode being in contact with a second conductive plug in the memory cell region of the base;
      a fourth insulating film on the second bottom electrode; and
      a second top electrode on the fourth insulating film, and
   the fourth insulating film is thinner than the first insulating film.

2. The semiconductor device according to claim 1, comprising a conductive layer that overlaps the first conductive plug in planar view and is electrically insulated from the first top electrode.

3. The semiconductor device according to claim 2, wherein a groove is between the first top electrode and the conductive layer.

4. The semiconductor device according to claim 1, wherein the first insulating film is a ferroelectric film.

5. The semiconductor device according to claim 1, wherein the first insulating film includes:
   a second insulating film; and
   a third insulating film on the second insulating film.

6. The semiconductor device according to claim 5, wherein
   a thickness of the fourth insulating film is the same as a thickness of the third insulating film.

7. The semiconductor device according to claim 1, wherein the fourth insulating film is a ferroelectric film.

8. The semiconductor device according to claim 5, wherein the third insulating film and the fourth insulating film contain the same material.

9. The semiconductor device according to claim 1, wherein an area of the first top electrode is larger than an area of the second top electrode in planar view.

10. The semiconductor device according to claim 1, wherein the first bottom electrode comprises:
    a titanium film;
    a first titanium aluminum nitride film on the titanium film, an upper surface of the first titanium aluminum nitride film is flat;
    a second titanium aluminum nitride film on the first titanium aluminum nitride film;
    an iridium film on the second titanium aluminum nitride film;
    an iridium oxide film on the iridium film; and
    a platinum film on the iridium oxide film.

11. A method of manufacturing a semiconductor device, comprising:
    forming a base comprising a memory cell region and a logic circuit region above a semiconductor substrate;
    forming a first conductive plug in the logic circuit region of the base;
    forming a first capacitor in the logic circuit region;
    forming a second conductive plug in the memory cell region of the base; and
    forming a second capacitor in the memory cell region, wherein
    the forming of the first capacitor comprises:
        forming a first bottom electrode, a part of a lower surface of the first bottom electrode being in contact with the first conductive plug;
        forming an first insulating film on the first bottom electrode; and
        forming a first top electrode on the first insulating film, the first top electrode being spaced apart from the first conductive plug in planar view,
    the forming of the second capacitor comprises:
        forming a second bottom electrode, a part of a lower surface of the second bottom electrode being in contact with the second conductive plug;
        forming a fourth insulating film on the second bottom electrode; and
        forming a second top electrode on the fourth insulating film, and
    the fourth insulating film is thinner than the first insulating film.

12. The method according to claim 11, comprising forming a conductive layer that overlaps the first conductive plug in planar view and is electrically insulated from the first top electrode.

13. The method according to claim 12, wherein the forming of the first top electrode and the forming of the conductive layer comprise:
    forming a conductive film on the first insulating film; and
    forming a groove that divides the conductive film into two portions, one of the two portions being the first top electrode and the other one being the conductive layer.

14. The method according to claim 11, wherein the first insulating film is a ferroelectric film.

15. The method according to claim 11, wherein the forming of the first insulating film comprises:
    forming a second insulating film; and
    forming a third insulating film on the second insulating film.

16. The method according to claim 15, wherein a thickness of the third insulating film is the same as a thickness of the fourth insulating film.

17. The method according to claim 11, wherein the fourth insulating film is a ferroelectric film.

18. The method according to claim 15, wherein the third insulating film and the fourth insulating film contain the same material.

19. The method according to claim 11, wherein an area of the first top electrode is larger than an area of the second top electrode in planar view.

20. The method according to claim 11, wherein the forming of the first bottom electrode comprises:
    forming a titanium film;
    forming a first titanium aluminum nitride film on the titanium film;
    planarizing an upper surface of the first titanium aluminum nitride film;
    forming a second titanium aluminum nitride film on the first titanium aluminum nitride film;
    forming an iridium film on the second titanium aluminum nitride film;
    forming an iridium oxide film on the iridium film; and
    forming a platinum film on the iridium oxide film.

* * * * *